(12) United States Patent
Ryu et al.

(10) Patent No.: US 10,224,114 B2
(45) Date of Patent: Mar. 5, 2019

(54) SEMICONDUCTOR DEVICE USING A PARALLEL BIT OPERATION AND METHOD OF OPERATING THE SAME

(71) Applicant: Samsung Electronics Co., Ltd., Suwon-si (KR)

(72) Inventors: Je-min Ryu, Seoul (KR); Hak-soo Yu, Seoul (KR); Reum Oh, Hwaseong-si (KR); Seong-young Seo, Hwaseong-si (KR); Soo-jung Rho, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/600,715

(22) Filed: May 20, 2017

(65) Prior Publication Data

US 2017/0352434 A1 Dec. 7, 2017

(30) Foreign Application Priority Data

Jun. 2, 2016 (KR) .................. 10-2016-0068849

(51) Int. Cl.
*G11C 29/12* (2006.01)
*G11C 5/00* (2006.01)
*G11C 29/26* (2006.01)
*G11C 29/54* (2006.01)

(52) U.S. Cl.
CPC .............. *G11C 29/12* (2013.01); *G11C 5/005* (2013.01); *G11C 29/26* (2013.01); *G11C 29/54* (2013.01); *G11C 2029/2602* (2013.01)

(58) Field of Classification Search
CPC ......... G11C 29/12; G11C 29/54; G11C 5/005; G11C 29/26; G11C 2029/2602
See application file for complete search history.

(56) References Cited

U.S. PATENT DOCUMENTS

| | | | |
|---|---|---|---|
| 5,617,531 A | 4/1997 | Crouch et al. | |
| 6,636,998 B1 | 10/2003 | Lee et al. | |
| 6,788,596 B2 * | 9/2004 | Kim | G11C 29/785 365/200 |
| 7,017,094 B2 | 3/2006 | Correale, Jr. et al. | |
| 7,243,165 B2 | 7/2007 | Kravec et al. | |
| 7,624,317 B2 * | 11/2009 | Byun | G11C 29/40 365/201 |
| 8,719,516 B2 | 5/2014 | Walker et al. | |
| 2003/0229636 A1 | 12/2003 | Mattausch et al. | |
| 2005/0114063 A1 * | 5/2005 | Terauchi | G11C 29/26 702/117 |
| 2008/0062785 A1 * | 3/2008 | Li | G11C 29/34 365/201 |
| 2009/0259895 A1 * | 10/2009 | Jung | G11C 29/1201 714/718 |

(Continued)

*Primary Examiner* — Khamdan N. Alrobaie
(74) *Attorney, Agent, or Firm* — Muir Patent Law, PLLC

(57) ABSTRACT

A memory device may include a memory cell array including a plurality of memory cells, and an internal operation circuit configured to perform a test operation in a test mode using a parallel bit operation of simultaneously comparing a plurality of bits and also perform an internal operation including a comparison operation with respect to external data in a normal mode other than the test mode using the parallel bit operation.

17 Claims, 22 Drawing Sheets

(56) References Cited

U.S. PATENT DOCUMENTS

2010/0251043 A1* 9/2010 Anzou ................... G11C 29/02
                                                                 714/719
2010/0312997 A1    12/2010 Walker
2010/0312998 A1    12/2010 Walker
2011/0093662 A1     4/2011 Walker et al.

* cited by examiner

SEMICONDUCTOR DEVICE USING A PARALLEL BIT OPERATION AND METHOD OF OPERATING THE SAME

CROSS-REFERENCE TO RELATED PATENT APPLICATION

This application claims priority under 35 USC § 119 to Korean Patent Application No. 10-2016-0068849, filed on Jun. 2, 2016, in the Korean Intellectual Property Office, the disclosure of which is incorporated herein in its entirety by reference.

BACKGROUND

Example embodiments relate to memory devices, and more particularly, to a memory device including a parallel bit test (PBT) circuit, and a memory system including the memory device.

With the development of memory systems including semiconductor memory devices, the number of semiconductor memory devices included in a single memory module or a memory system has gradually increased. Accordingly, a probability of occurrence of defects in semiconductor memory devices has also increased, and a test of detecting and sorting out these defects has become important.

In a general test for semiconductor memory devices, an external test apparatus writes data to memory cells of a semiconductor memory device that is tested, reads data from the memory cells, and compares read-out data with the written data to thereby determine whether the semiconductor memory device is good or defective.

As the storage capacity of semiconductor memory devices increases, a testing time period may increase. Thus, to improve the productivity of a process of manufacturing semiconductor memory devices, a demand for reducing the testing time increases. In response to this demand, a PBT circuit is typically used at an inspection stage of semiconductor memory devices.

In general, since volatile memory responds and operates at a high speed, the volatile memory is widely used as the main memory of a system. Generally, the volatile memory may write or read data under the control of a host.

DRAMs including a circuit that internally performs some calculation operations of a host have been recently developed. Since the workload on the host decreases, the entire performance of memory systems including such DRAMs may improve. However, a special interface for the internal operations may be required, leading to a cost increase for an apparatus for performing the internal operations.

SUMMARY

Example embodiments may provide a semiconductor memory device that performs an internal operation by using a parallel bit test (PBT) circuit.

According to an aspect of the inventive concept, there is provided a memory device including a memory cell array comprising a plurality of memory cells; and an internal operation circuit configured to perform a test operation and an internal operation using a parallel bit operation of simultaneously comparing a plurality of bits, wherein the internal operation circuit is configured to perform the test operation in a test mode of the memory device and the internal operation in an internal operation mode other than the test mode of the memory device based on a command signal received from an outside of the memory device.

According to another aspect of the inventive concept, there is provided a semiconductor device including an internal operation circuit configured to perform a test operation in a test mode using a parallel bit operation of simultaneously comparing a plurality of bits and to perform an internal operation comprising a comparison operation with respect to external data in a normal mode other than the test mode by using the parallel bit operation. The internal operation circuit includes a mode selector configured to set a mode of the internal operation circuit as the test mode or an internal operation mode of the normal mode; a parallel bit comparator configured to perform a parallel bit comparison (PBC) between data read out from a memory cell array and the external data received from an outside of the memory device by using the parallel bit operation; and a result generator configured to output a comparison result obtained by the parallel bit comparator.

According to another aspect of the inventive concept, there is provided a memory device including a memory cell array comprising a plurality of memory cells, and an internal operation circuit including a parallel bit comparator configured to simultaneously compare first data from a first set of memory cells of the memory cell array with second data received from outside the memory device in an internal operation mode of the memory device. The parallel bit comparator may operate in a test mode of the memory device for a parallel bit test operation.

BRIEF DESCRIPTION OF THE DRAWINGS

Exemplary embodiments of the present disclosure will be more clearly understood from the following detailed description taken in conjunction with the accompanying drawings in which.

DETAILED DESCRIPTION

Figure 1:
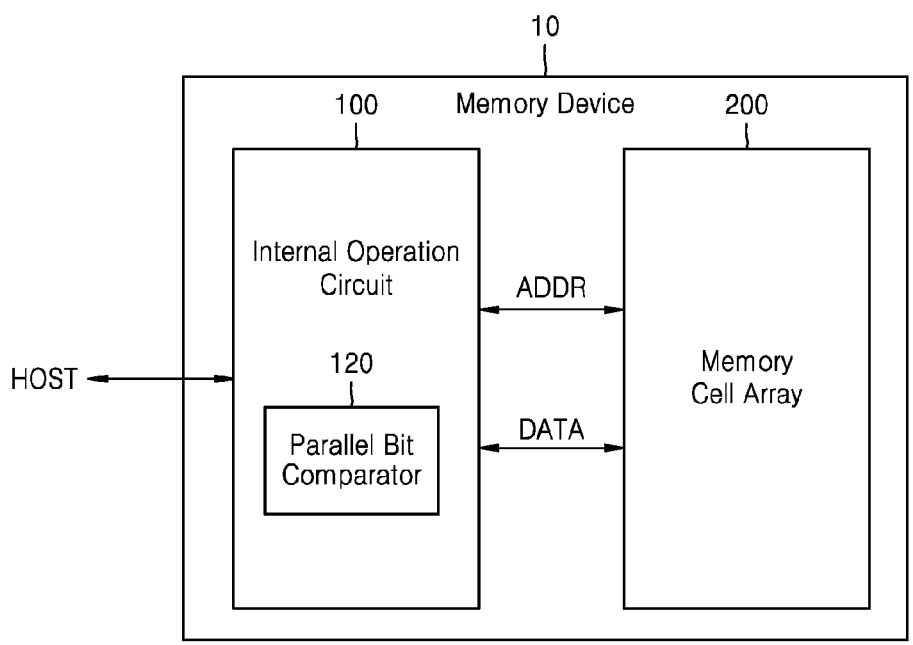
FIG. 1 is a schematic block diagram of a memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic block diagram of a memory device 10 according to example embodiments.

Referring to FIG. 1, the memory device 10 may include an internal operation circuit 100 and a memory cell array 200. The internal operation circuit 100 and the memory cell array 200 are connected to and communicate with each other, and thus, are able to transmit or receive an address ADDR and/or data DATA to or from each other. In example embodiments, the internal operation circuit 100 and the memory cell array 200 are connected to and communicate with each other through various internal circuits.

The internal operation circuit 100 may include a parallel bit comparator 120. The parallel bit comparator 120 may perform a parallel bit test (PBT) in a test mode of the memory device 10. In order for a data read operation and a data write operation to be accurately performed in the memory device 10, defective cells in the memory cell array 200 of the memory device 10 need to be detected. As the integration densities of memory devices increase and the number of cells of a memory device has reached several tens of millions or more, a reduction in a defective cell testing time is associated with an increased production. Accordingly, a PBT is used to reduce the time for testing a memory device.

In example embodiments, the internal operation circuit 100 may perform various internal operations by using a parallel bit comparison function of the parallel bit comparator 120. The various internal operations may include a comparison operation of comparing all data or part of the data stored in the memory cell array 200 with comparison data received from a host HOST or a memory controller, a search operation of searching for comparison data using the comparison operation, and an application operation of applying a comparison result of the comparison operation. The internal operation circuit 100 may acquire a comparison result by using a comparison operation. The comparison result may include matching data corresponding to the comparison data from among data stored in the memory cell array 200 and an address of the match data. In example embodiments, the internal operations of the memory device 10 may be different from a test operation of the memory device 10.

The application operation may include a rewrite operation, a copy operation, a move operation, and a swap operation. The rewrite operation may be an operation of reading matching data from memory cells corresponding to a first address, changing the format of the matching data, and then rewriting the format-changed matching data to the memory cell array 200. The copy operation may be an operation of writing the matching data to memory cells corresponding to a target address received from an external source. The move operation may be an operation of changing the address of the matching data to the target address. The swap operation may be an operation of swapping the matching data with data stored in memory cells corresponding to the target address. The application operation may be any of various operations that may be performed on the memory cell array 200, but the inventive concept is not limited to the above-exemplified operations.

The memory cell array 200 includes a plurality of memory cells accessible by word lines and bit lines. The memory cells may be volatile memory cells or non-volatile memory cells. For example, the memory cells may be Dynamic Random Access Memory (DRAM) cells, flash memory cells, Magnetoresistive Random Access Memory (MRAM) cells, or Phase-change Random Access Memory (PRAM) cells, and are not limited to particular types of memory cells.

Figure 2:
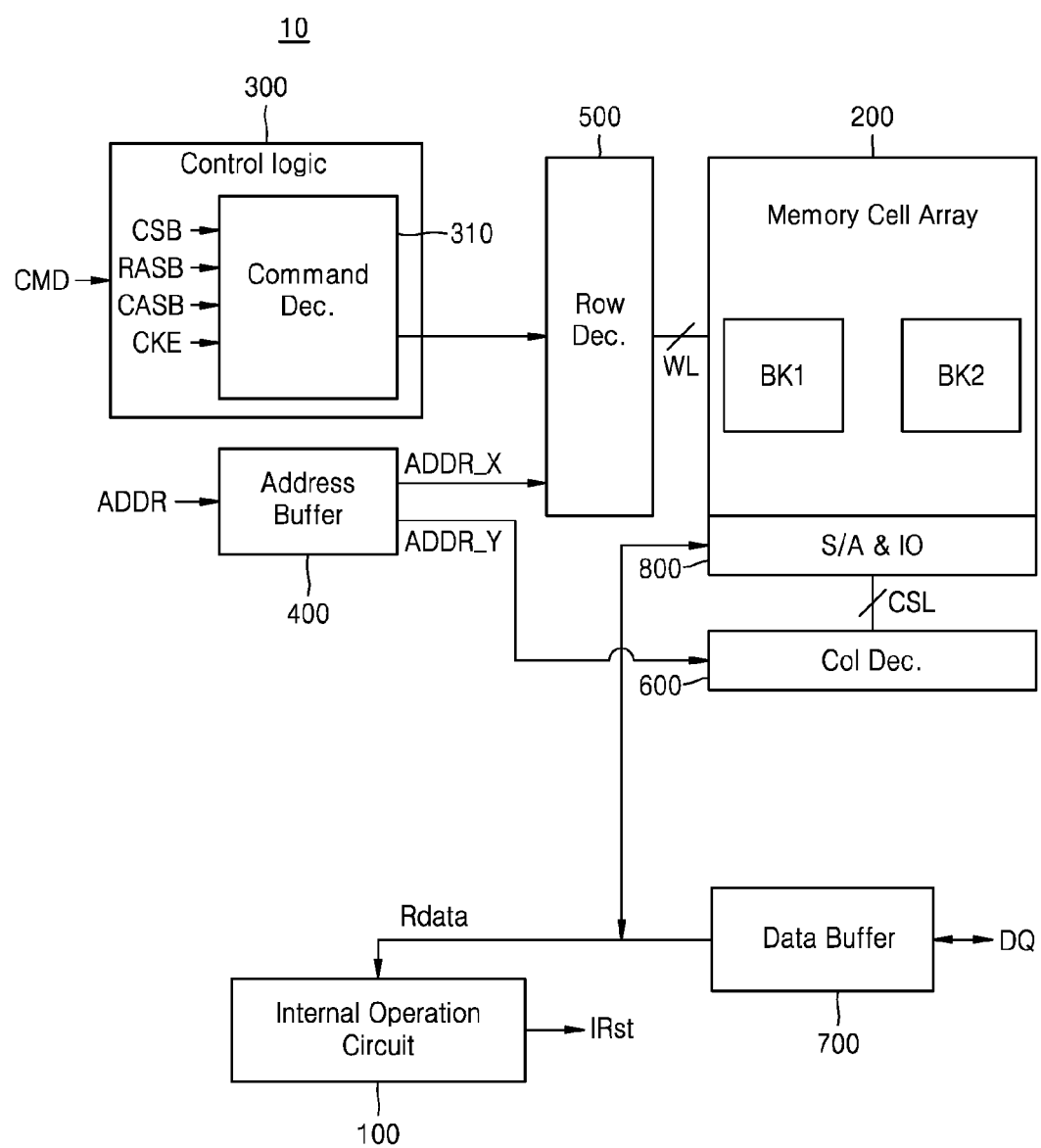
FIG. 2 is a block diagram of the memory device, according to example embodiments.

FIG. 2 is a block diagram of the memory device 10, according to example embodiments.

Referring to FIG. 2, the memory device 10 may include the internal operation circuit 100, the memory cell array 200, a control logic circuit 300, an address buffer 400, a row decoder 500, a column decoder 600, a data buffer 700, and a sense amplifier and 10 interface circuit 800.

The control logic circuit 300 may control operations of the memory device 10. For example, the control logic circuit 300 may receive a command CMD and may generate control signals such that the memory device 10 performs a write operation or a read operation. The control logic circuit 300 may include a command decoder 310 for decoding the command CMD received from a memory controller.

The command decoder 310 may generate several control signals by decoding, for example, a chip selection signal CSB, a row address strobe signal RASB, a column address strobe signal CASB, a write enable signal WEB, and a clock enable signal CKE.

The memory cell array 200 may include a plurality of unit memory cells each unit including memory cells and operate in response to a word line driving signal WL and a column selection signal CSL. The memory cell array 200 may include at least one bank (or, one block) BKn.

The address buffer 400 may generate a row address ADDR_X and a column address ADDR_Y, based on an external address ADDR. The row decoder 500 may generate a decoded row address by decoding the row address ADDR_X, and generates the word line driving signal WL based on the decoded row address. The row decoder 500 may change a voltage level of the word line driving signal WL in a test mode. The column decoder 600 may generate a decoded column address by decoding the column address ADDR_Y, and may generate the column selection signal CSL based on the decoded column address. In example embodiments, the address buffer 400 may be an address generator including a counter to generate the row address ADDR_X and the column address ADDR_Y.

The data buffer 700 may receive data in response to the control signals of the control logic circuit 300 and may write the received data to the memory cell array 200.

The sense amplifier and 10 interface circuit 800 may receive read data Rdata from the memory cell array 200 and may provide the read data Rdata to the internal operation circuit 100.

The internal operation circuit 100 may receive the command CMD from the host HOST. The internal operation circuit 100 may receive the command CMD from the host HOST via the control logic circuit 300 as shown in FIG. 2, or may directly receive the command CMD from the host HOST by an external pin. When the command CMD is analyzed as an internal operation conducting command, the parallel bit comparator 120 may compare the comparison data received from the host HOST with the read data read-out from the memory cell array 200. The internal operation circuit 100 may perform various internal operations by outputting an internal operation result IRst according to a comparison result obtained by the parallel bit comparator 120. The performance of the internal operations will be described later in detail.

Figure 3:
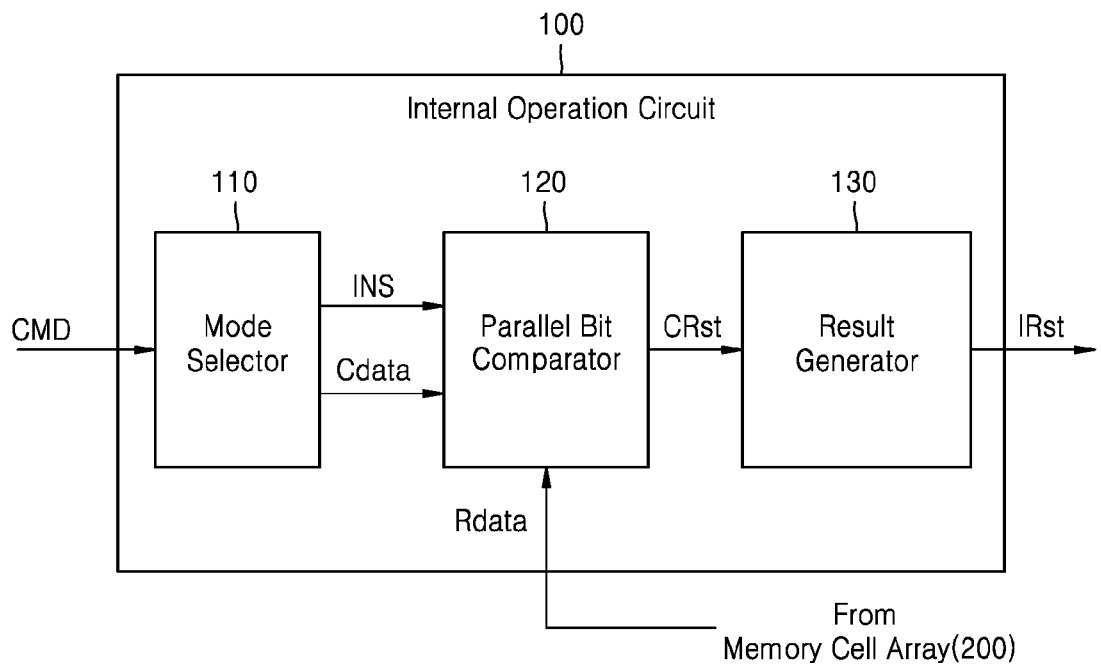
FIG. 3 is a block diagram of an internal operation circuit according to example embodiments.

FIG. 3 is a block diagram of the internal operation circuit 100 according to example embodiments.

Referring to FIG. 3, the internal operation circuit 100 may include a mode selector 110, the parallel bit comparator 120, and a result generator 130.

The mode selector 110 receives the command CMD from an external source and sets a mode of the internal operation circuit 100 as a test mode or an internal operation mode in response to the command CMD. The mode selector 110 may output an instruction INS according to the internal operation mode to the parallel bit comparator 120. In the internal operation mode, the mode selector 110 may output comparison data Cdata to the parallel bit comparator 120. The comparison data Cdata may be non-error data and received from the host HOST (or, a memory controller).

The parallel bit comparator 120 may perform a PBT or a parallel bit comparison (PBC) according to the instruction INS.

When the instruction INS is a test mode instruction, the parallel bit comparator 120 may perform a PBT. In the PBT mode, the plurality of memory cells of the memory cell array 200 may be coupled to a number of data lines. When one word line is selected, for example, 4*16 data bits from memory cells connected to the selected word line may be read out simultaneously through data lines. The 64 data bits may be read data Rdata read out from the memory cell array 200 and transferred to the parallel bit comparator 120, the number of the data lines corresponding to the parallel bit comparator 120 may be changed. After comparing the data bits with each other the memory device 10 may detect whether the memory cell array 200 has a defective memory cell or not based on a comparison result. Thus, the test time for the memory device 10 may be reduced by using the parallel bit comparator 120.

When the instruction INS is an internal operation mode instruction, the parallel bit comparator 120 may perform a PBC. When the parallel bit comparator 120 performs a PBC, the parallel bit comparator 120 may compare the read data Rdata read out from the memory cell array 200 with the comparison data Cdata received from the mode selector 110. The parallel bit comparator 120 may output a comparison result CRst of the PBC to the result generator 130.

Hereinafter, the test operation mode and the internal operation mode may be different modes from each other. The test operation may not be conducted in a normal operation (e.g., a read, a write, a refresh, an active, a precharge, or an arithmetic operation, etc.) of a memory device, and the internal operation may be performed during the normal operation of the memory device.

The result generator 130 may output the internal operation result IRst in response to the received comparison result CRst. As will be described later, the internal operation result IRst may include at least one of a signal Hit, a signal Miss, a signal Up, a signal Down, matching data Mdata, rewrite data Mdata_f, a matching address Maddr, and a target address Gaddr.

Figure 4A:
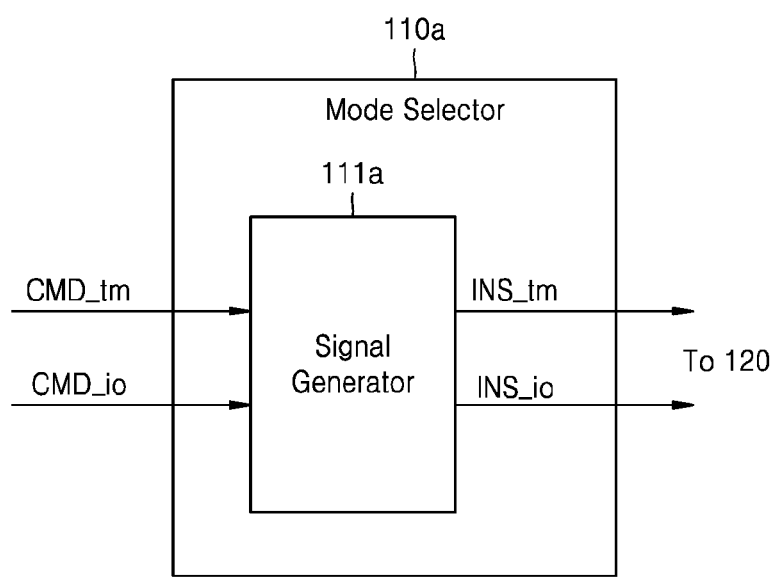
FIG. 4A is a block diagram of a mode selector according to example embodiments.

FIG. 4A is a block diagram of a mode selector 110*a* according to example embodiments.

Referring to FIGS. 2, 3 and 4A, the mode selector 110*a* may include a signal generator 111*a*. The mode selector 110*a* may receive a test mode command CMD_tm or an internal operation mode command CMD_io from the host HOST or the control logic circuit 300. The signal generator 111*a* may generate different instructions INS according to a type of the received command CMD. When the received command CMD is a test mode command CMD_tm, the signal generator 111*a* may generate a test mode instruction INS_tm. When the received command CMD is an internal operation mode command CMD_io, the signal generator 111*a* may generate an internal operation mode instruction INS_io. The test mode command CMD_tm and the internal operation mode command CMD_io may be received by independent external pins, respectively.

Figure 4B:
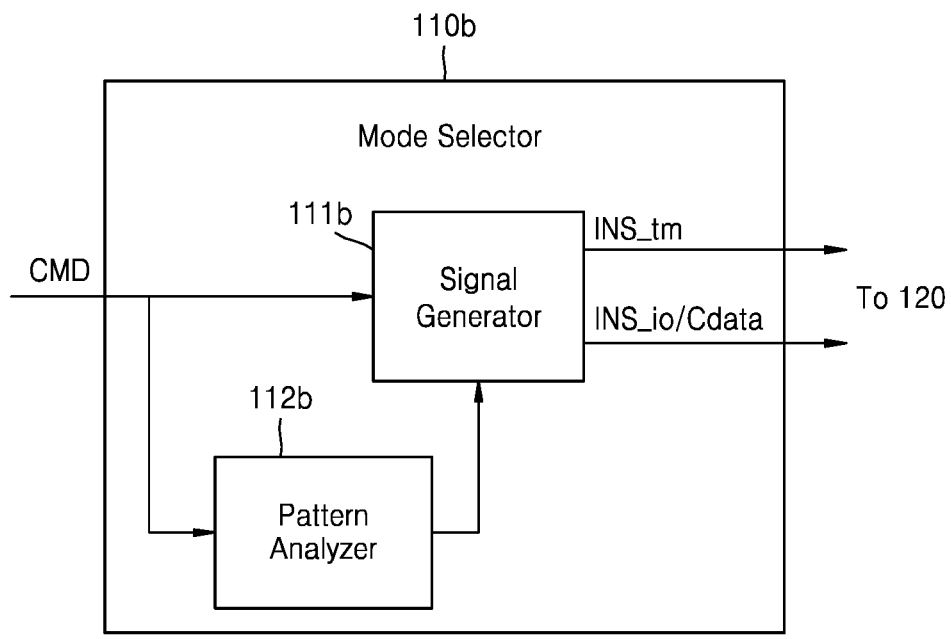
FIG. 4B is a block diagram of a mode selector according to example embodiments.

FIG. 4B is a block diagram of a mode selector 110*b* according to example embodiments. A description of FIG. 4B that is the same as given above with reference to FIGS. 4A will not be repeated herein.

Referring to FIGS. 2, 3 and 4B, the mode selector 110*b* may include a signal generator 111*b* and a pattern analyzer 112*b*.

The pattern analyzer 112*b* may analyze the command CMD received from the host HOST or the control logic circuit 300 and control the signal generator 111*b* according to the analyzed command CMD. The pattern analyzer 112*b* may receive the command CMD in the form of data or address, and the command CMD may include a predetermined pattern. When the pattern analyzer 112*b* determines that the command CMD that was analyzed is the test mode command CMD_tm, the pattern analyzer 112*b* may control the signal generator 111*b* to output the test mode instruction INS_tm. When the pattern analyzer 112b determines that the command CMD that was analyzed is an internal operation mode command CMD_io, the pattern analyzer 112b may control the signal generator 111b to output the internal operation mode instruction INS_io.

The command CMD may further include the comparison data Cdata in addition to a command for selecting a mode. When the pattern analyzer 112b determines that the command CMD is the internal operation mode command CMD_io, the signal generator 111b may receive the comparison data Cdata from the host HOST and output the comparison data Cdata to the parallel bit comparator 120.

Figure 4C:
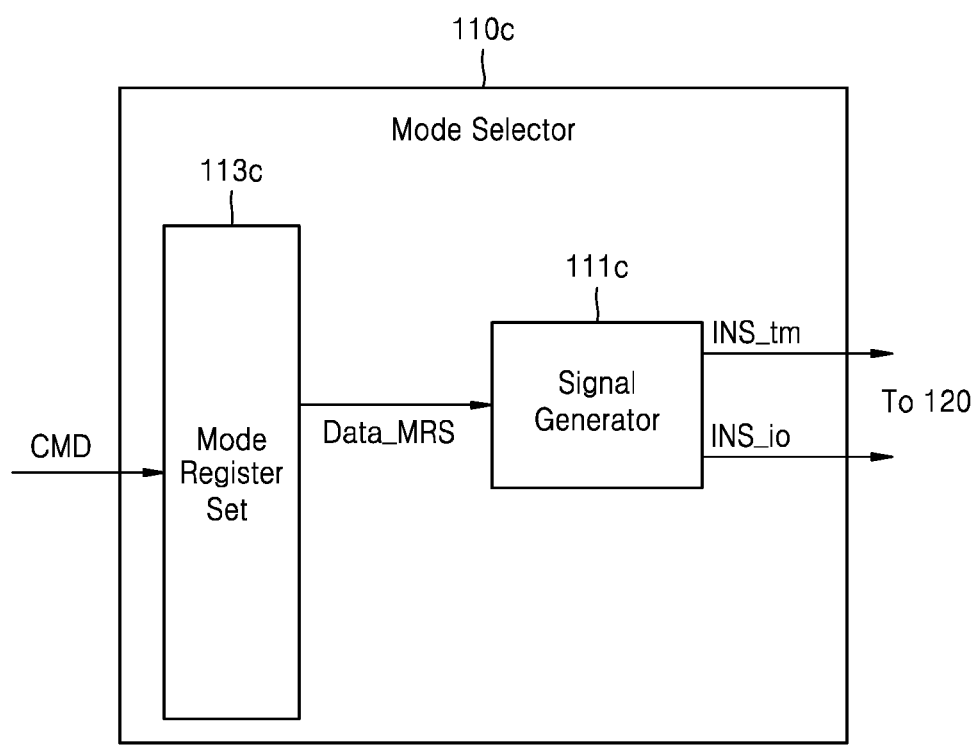
FIG. 4C is a block diagram of a mode selector according to example embodiments.

FIG. 4C is a block diagram of a mode selector 110c according to example embodiments. A description of FIG. 4C that is the same as given above with reference to FIGS. 4A and 4B will not be repeated herein.

Referring to FIGS. 2, 3 and 4C, the mode selector 110c may include a signal generator 111c and a mode register set 113c. The mode register set 113c may store data Data_MRS necessary for setting a mode according to the command CMD. When the mode register set 113c receives the command CMD from the host HOST or the control logic circuit 300, the mode register set 113c may output the data Data_MRS, which is necessary for setting a mode according to the received command CMD, to the signal generator 111c. In response to the data Data_MRS necessary for mode setting, the signal generator 111c may output the test mode instruction INS_tm or the internal operation mode instruction INS_io to the parallel bit comparator 120.

Figure 5A:
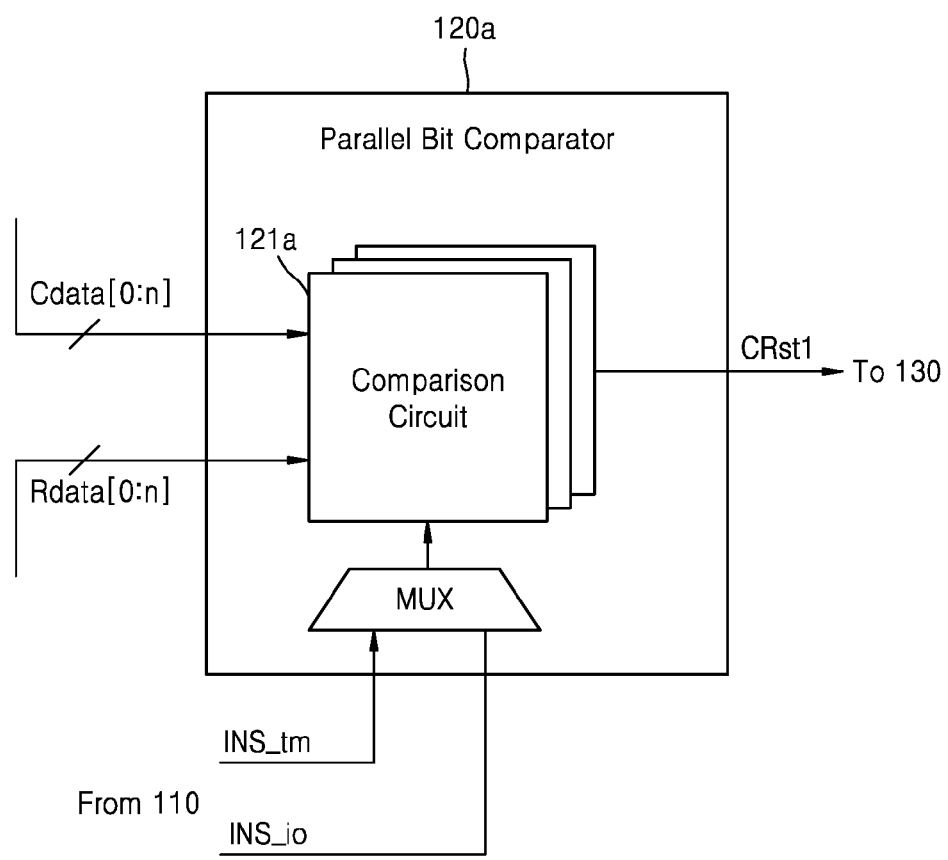
FIG. 5A is a block diagram of a parallel bit comparator according to example embodiments.

FIG. 5A is a block diagram of a parallel bit comparator 120a according to example embodiments.

Referring to FIGS. 2, 3 and 5A, the parallel bit comparator 120a may include a comparison circuit 121a. Since the parallel bit comparator 120a performs a PBC, the parallel bit comparator 120a may include at least one comparison circuit 121a connected in parallel. The comparison circuits 121a may receive one of the test mode instruction INS_tm and the internal operation mode instruction INS_io, compare at least one bit, and output a first comparison result CRst1. For example, when the instruction INS of the mode selector 110 is the test mode instruction INS_tm (this case is not shown in FIG. 5A), the comparison circuits 121a may receive original data stored in a separate buffer with the read data read-out from the memory cell array 200. The original data may be data that is confirmed to have no errors. The comparison circuits 121a may output a comparison result by comparing the original data with the read data.

In example embodiments, when the instruction INS of the mode selector 110 is the internal operation mode instruction INS_io, the comparison circuits 121a may compare the comparison data Cdata received from the host HOST or the mode selector 110 with the read data read-out from the memory cell array 200. The comparison circuits 121a in the internal operation mode may output the first comparison result CRst1 to the result generator 130. When the comparison data Cdata is identical with the read data Rdata, the first comparison result CRst1 may be '1'. When the comparison data Cdata is not identical with the read data Rdata, the first comparison result CRst1 may be '0'.

According to an embodiment, the parallel bit comparator 120a may further receive information about the range of the read data Rdata from the host HOST. For example, when a command including the contents of conduction of a search operation with respect to a first bank BK1 included in the memory cell array 200 is received from the host HOST by the internal operation circuit 100, the parallel bit comparator 120a may receive all of the data of the memory cells included in the first bank BK1 from the data buffer 700 and compare the received data with the comparison data Cdata. When data that is identical with the comparison data Cdata has been written to the memory cells included in the first bank BK1 as a result of the comparison, the parallel bit comparator 120a may output '1' to the result generator 130, and otherwise, the parallel bit comparator 120a may output '0' to the result generator 130.

Figure 5B:
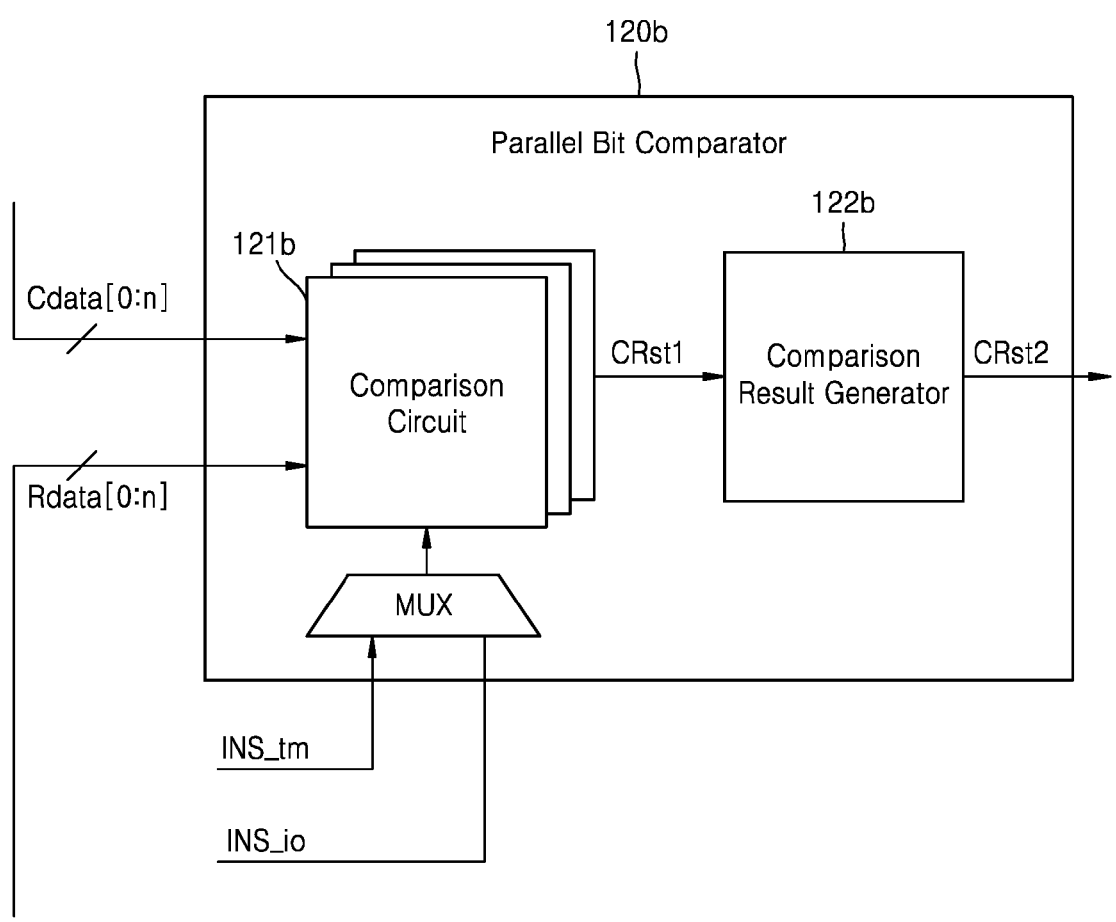
FIG. 5B is a block diagram of a parallel bit comparator according to example embodiments.

FIG. 5B is a block diagram of a parallel bit comparator 120b according to example embodiments. A description of FIG. 5B that is the same as given above with reference to FIG. 5A will not be repeated herein.

Referring to FIGS. 2, 3 and 5B, the parallel bit comparator 120b may include a comparison circuit 121b and a comparison result generator 122b. The comparison circuit 121b may transmit the first comparison result CRst1 obtained by the comparison between the comparison data Cdata and the read data Rdata to the comparison result generator 122b. When the comparison data Cdata is identical with the read data Rdata, the first comparison result CRst1 may be '1'. When the comparison data Cdata is not identical with the read data Rdata, the first comparison result CRst1 may be '0'.

The comparison result generator 122b may generate a second comparison result CRst2 based on the received first comparison result CRst1, and may transmit the second comparison result CRst2 to the result generator 130. The second comparison result CRst2 may include match data Mdata matched with the comparison data Cdata as a result of the comparisons by the comparison circuit 121b, and an address Maddr of the matching data Mdata. In example embodiments, the comparison result generator 122b may include an address fetch circuit and a data fetch circuit (not shown). The address fetch circuit may fetch a matching address Maddr or a target address Gaddr to perform an internal operation. The data fetch circuit may fetch matching data Mdata or rewrite data Mdata_f.

The parallel bit comparator 120b may include at least one comparison circuit 121b. When a plurality of comparison circuits 121b are included, the first comparison result CRst1 may include a plurality of bits. When the comparison result generator 122b receives the first comparison result CRst1 including the plurality of bits, the comparison result generator 122b may output the second comparison result CRst2 by processing the plurality of bits.

Figure 5C:
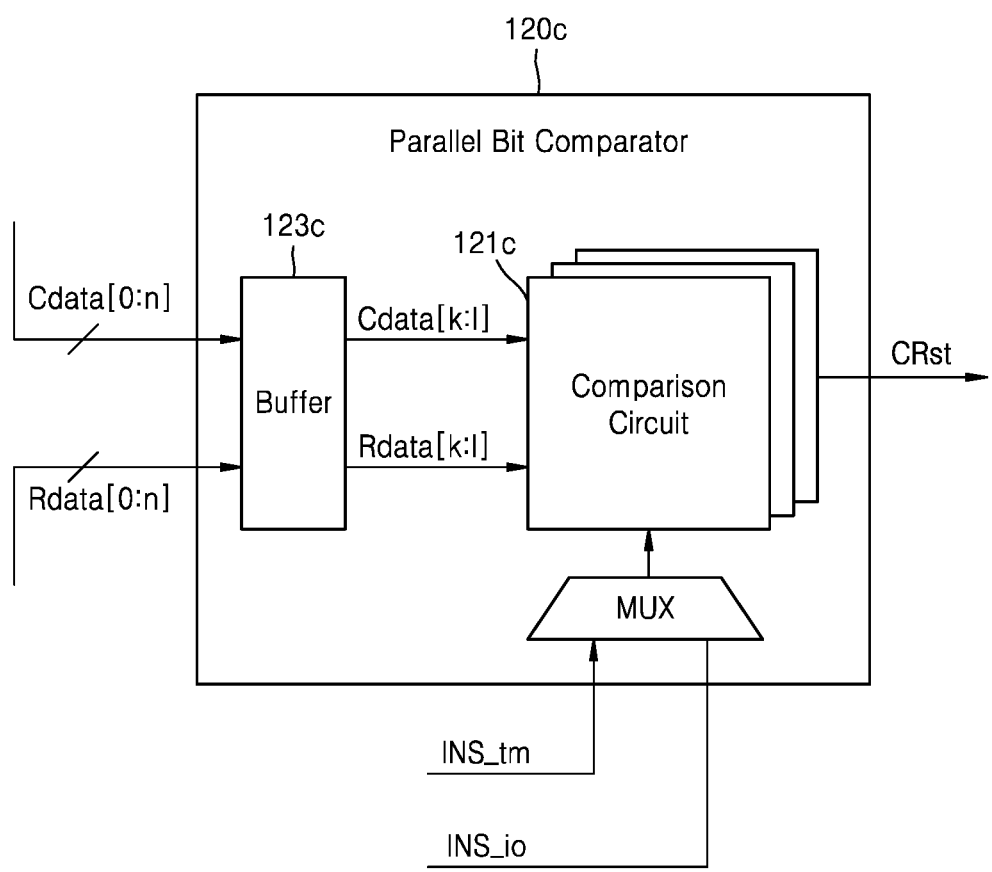
FIG. 5C is a block diagram of a parallel bit comparator according to example embodiments.

FIG. 5C is a block diagram of a parallel bit comparator 120c according to example embodiments. A description of FIG. 5C that is the same as given above with reference to FIG. 5A will not be repeated herein.

Referring to FIGS. 2, 3, and 5C, the parallel bit comparator 120c may include a comparison circuit 121c and a buffer 123c. The buffer 123c may temporarily store the comparison data Cdata and the read data Rdata. The comparison circuit 121c may compare the comparison data Cdata and the read data Rdata stored in the buffer 123c with each other, according to a comparison capacity of the comparison circuit 121c. For example, if the comparison circuit 121c is able to simultaneously compare (1−k+1) bits of n+1 bits of comparison data Cdata[0:n] and n+1 bits of read data Rdata[0:n], the buffer 123c may temporarily store the comparison data Cdata[0:n] and the read data Rdata[0:n], and the comparison circuit 121c may sequentially perform a PBC with respect to (1−k+1) comparison data Cdata[k1] and (1−k+1) read data Rdata[k:1].

Figure 6:
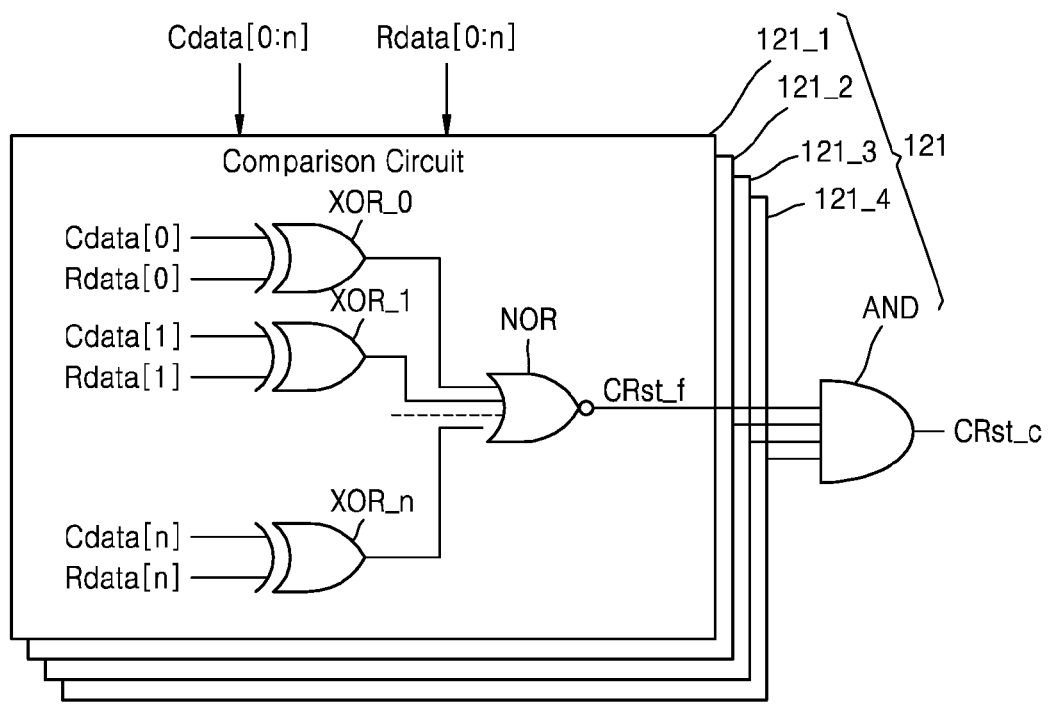
FIG. 6 is a circuit diagram of a comparison circuit according to example embodiments.

FIG. 6 is a circuit diagram of a comparison circuit 121 according to example embodiments.

Referring to FIG. 6, the comparison circuit 121 may include at least one sub comparison circuit, namely, sub comparison circuits 121_1, 121_2, 121_3, and 121_4. Although the four sub comparison circuits 121_1, 121_2, 121_3, and 121_4 are illustrated in FIG. 6, this is only an example, and the inventive concept is not limited thereto. Each of the sub comparison circuits 121_1, 121_2, 121_3, and 121_4 may include a plurality of XOR gates XOR_0 through XOR_n and a single NOR gate NOR. Each of the XOR gates XOR_0 through XOR_n may compare one bit of the comparison data Cdata with the read data Rdata. When two data that are to be compared are identical with each other, each XOR gate outputs '0', and otherwise, each XOR gate outputs '1'. Only when all inputs of the NOR gate are 0, the NOR gate outputs '1'. When any one of the inputs of the NOR gate is 1, the NOR gate outputs '0'.

Each of the sub comparison circuits 121_1, 121_2, 121_3, and 121_4 may perform a fine comparison. The comparison circuit 121 may also perform a coarse comparison by combining fine comparison results CRst_f of the sub comparison circuits 121_1, 121_2, 121_3, and 121_4 into an AND gate. The comparison circuit 121 may output the fine comparison results CRst_f obtained without using the AND gate or a coarse comparison result CRst_c obtained using the AND gate.

For example, if the comparison data Cdata has data of '0100' and the read data Rdata has also data of '0100', the four XOR gates XOR_0 through XOR_3 may compare the four bits of the comparison data Cdata with those of the read data Rdata, respectively. In this case, since the comparison data Cdata and the read data Rdata are identical with each other, all of the XOR gates XOR_0 through XOR_3 may output '0'. Since the outputs of the XOR gates XOR_0 through XOR_3 are all '0', the NOR gate may output '1' as the comparison result CRst_f in response to the outputs of '1'.

As another example, if the comparison data Cdata includes '0100' and the read data Rdata includes '0101', the three XOR gates XOR_0 through XOR_2 may output '0' because the first three bits of the comparison data Cdata, which are '010', are identical with those of the read data Rdata, respectively. However, since the last bit of the comparison data Cdata[3] is '0' and that of the read data Rdata[3] is '1', the XOR gate XOR_3 outputs '1'. In this case, since the outputs of all of the XOR gates XOR_0 through XOR_3 are not '0', the NOR gate may output '0' as the comparison result CRst_f.

According to an embodiment, the comparison circuit 121 may further include a single AND gate for coarse comparison. Only when all of the fine comparison results CRst_f are '1', the coarse comparison result CRst_c may be '1'. When any one of the fine comparison results CRst_f is '0', the coarse comparison result CRst_c may be '0'.

Figure 7:
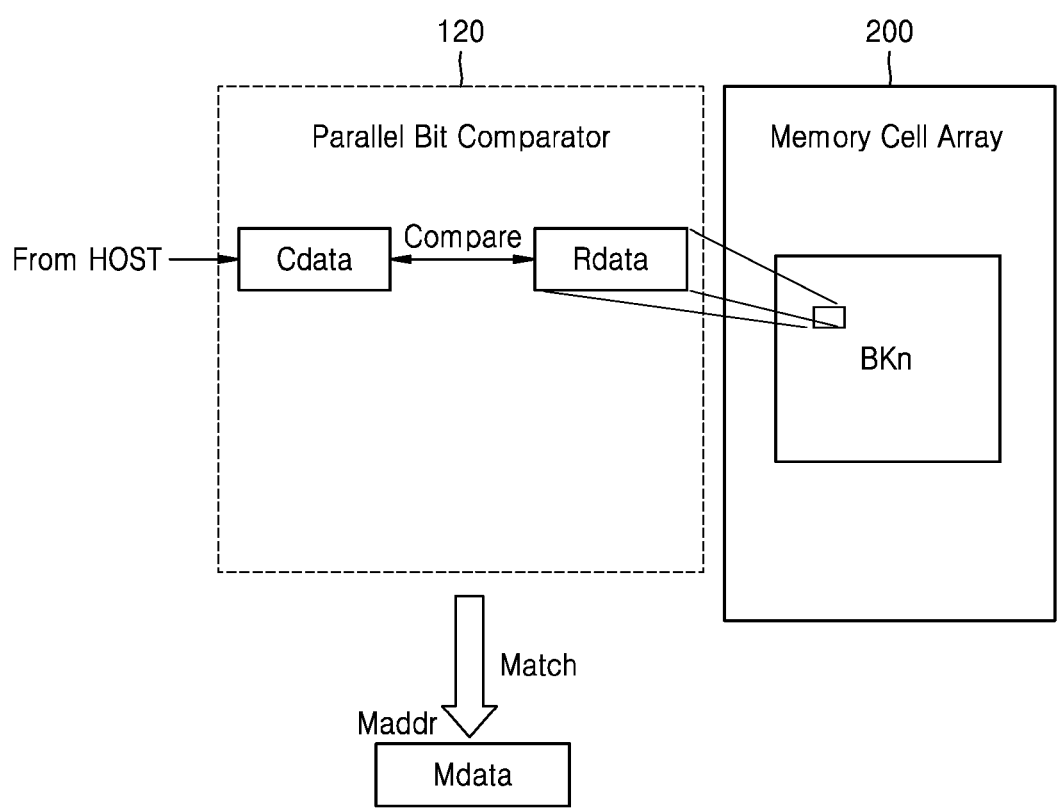
FIG. 7 is a block diagram of an operation of the parallel bit comparator according to example embodiments.

FIG. 7 is a block diagram of an operation of the parallel bit comparator 120 according to example embodiments. A description of FIG. 7 that is the same as given above with reference to FIGS. 2, 3, and 5A will not be repeated herein.

Referring to FIG. 7, the memory cell array 200 may include at least one bank. The parallel bit comparator 120 may compare the comparison data Cdata received from the host HOST with the read data Rdata read-out from the memory cell array 200. When the comparison data Cdata is identical with the read data Rdata as a result of the comparison, the parallel bit comparator 120 may output the read data Rdata as the matching data Mdata and may also output the address of the matching data Mdata as the matching address Maddr. When the command CMD received from the host HOST by using the mode selector 110 is a command for a search operation and a search range is particularly limited to an n-th bank BKn, the parallel bit comparator 120 may perform a PBC with respect to the read data Rdata written to all of the memory cells of the n-th bank BKn. When the n-th bank BKn includes read data Rdata that is identical with the comparison data Cdata, the parallel bit comparator 120 may output '1'. On the other hand, when the n-th bank BKn does not include read data Rdata that is identical with the comparison data Cdata, the parallel bit comparator 120 may output '0'.

Figure 8A:
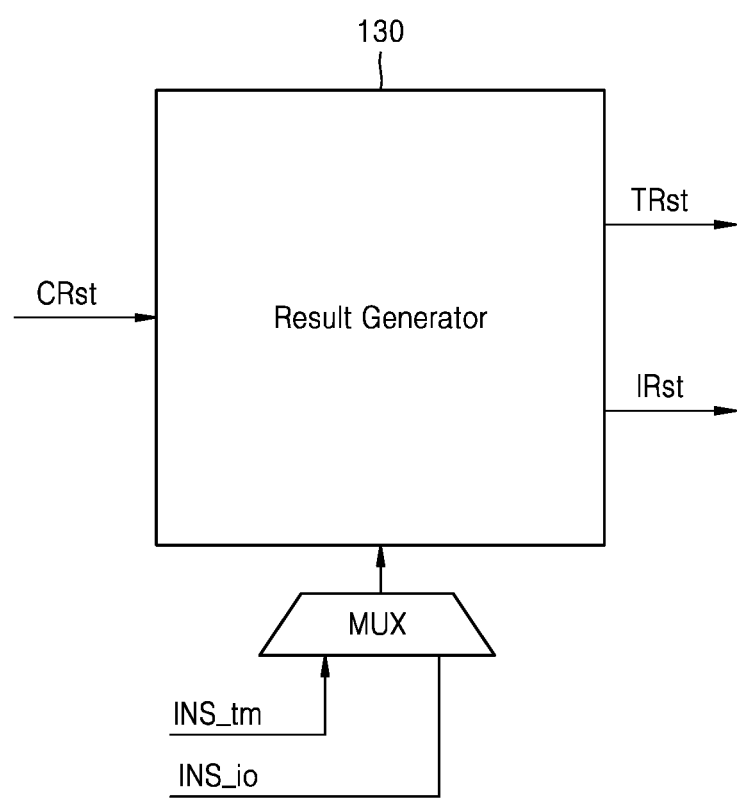
FIG. 8A is a block diagram of a result generator according to example embodiments.

FIG. 8A is a block diagram of the result generator 130 according to example embodiments.

Referring to FIGS. 2, 3, and 8A, the result generator 130 may receive the comparison result CRst from the parallel bit comparator 120 and may selectively receive the test mode instruction INS_tm or the internal operation mode instruction INS_io from the mode selector 110. In response to the test mode instruction INS_tm from the mode selector 110, the result generator 130 may output a test result TRst. In response to the internal operation mode instruction INS_io from the mode selector 110, the result generator 130 may output the internal operation result IRst.

The type of an internal operation may be specified by the internal operation mode instruction INS_io. For example, as a result of analyzing the command CMD received from the host HOST, the mode selector 110 may output, as the internal operation mode instruction INS_io, a search operation instruction INS_sch, a rewrite operation instruction INS_rewrite, a copy operation instruction INS_copy, a move operation instruction INS_move, or a swap operation instruction INS_swap to the result generator 130.

Figure 8B:
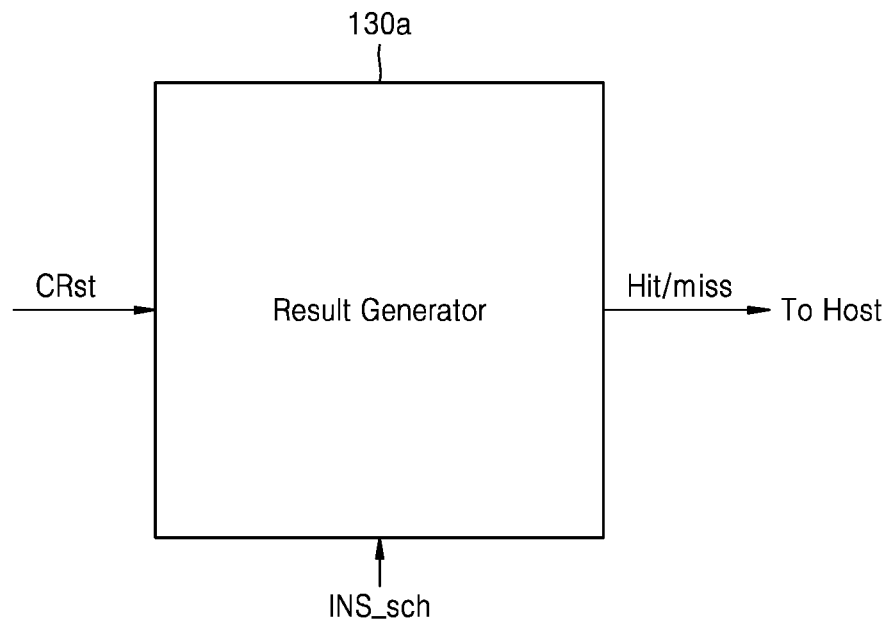
FIG. 8B is a block diagram of a result generator according to example embodiments.

FIG. 8B is a block diagram of a result generator 130a according to example embodiments. A description of FIG. 8B that is the same as given above with reference to FIG. 8A will not be repeated herein.

Referring to FIGS. 2, 3, 8A, and 8B, FIG. 8B illustrates the case where the result generator 130a receives the search operation instruction INS_sch as the internal operation mode instruction INS_io from the mode selector 110. In other words, FIG. 8B illustrates the result generator 130a when the internal operation circuit 100 conducts a search operation.

When the result generator 130a receives the search operation instruction INS_sch from the mode selector 110 and receives '1' as the comparison result CRst from the parallel bit comparator 120, the result generator 130a may output a signal Hit to the host HOST. On the other hand, when the result generator 130a receives '0' as the comparison result CRst from the parallel bit comparator 120, the result generator 130a may output a signal Miss to the host HOST. The result generator 130a may output the signals Hit and Miss to a host or a memory controller through a DQ pin of a memory device.

Figure 8C:
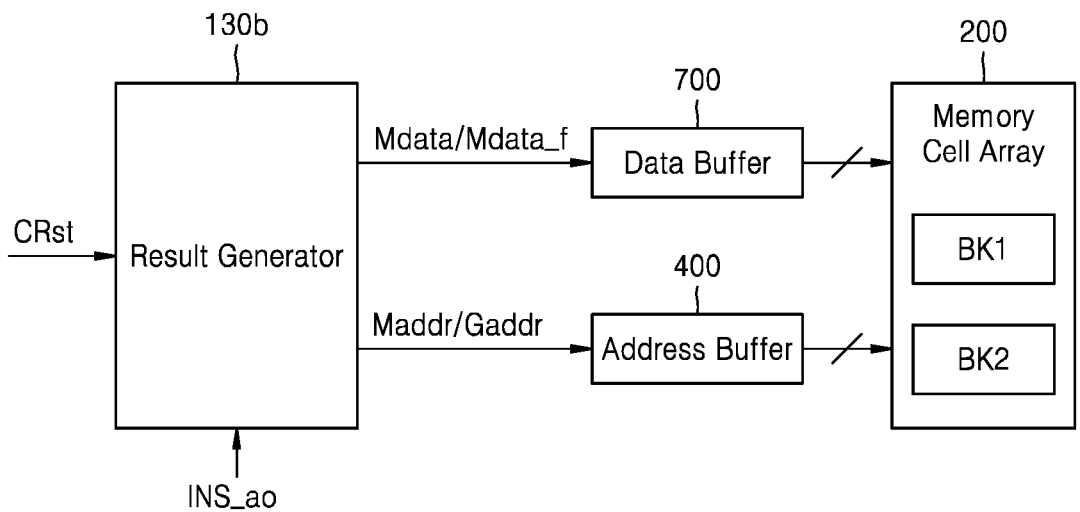
FIG. 8C is a block diagram illustrating a result generator according to example embodiments.

FIG. 8C is a block diagram illustrating a result generator 130b according to example embodiments. A description of FIG. 8C that is the same as given above with reference to FIG. 8A will not be repeated herein.

Referring to FIGS. 2, 3, 8A, and 8C, FIG. 8C illustrates the case where the result generator 130b receives the application operation instruction INS_ao as the internal operation mode instruction INS_io from the mode selector 110. The application operation instruction INS_ao includes the rewrite operation instruction INS_rewrite, the copy operation instruction INS_copy, the move operation instruction INS_move and the swap operation instruction INS_swap.

In response to the application operation instruction INS_ao, the result generator 130*b* outputs the matching data Mdata matched with the comparison data Cdata and/or the matching address Maddr of the matching data Mdata, based on the comparison result CRst received from the parallel bit comparator 120.

In example embodiments, the result generator 130*b* may include an address fetch circuit and a data fetch circuit (not shown). The address fetch circuit may fetch a matching address Maddr or a target address Gaddr to perform an internal operation. The data fetch circuit may fetch matching data Mdata or rewrite data Mdata_f.

When the application operation instruction INS_ao is the rewrite operation instruction INS_rewrite, the result generator 130*b* may further receive rewrite data Mdata_f that is to be changed. Thereafter, the result generator 130*b* may output the rewrite data Mdata_f to the data buffer 700 and output the matching address Maddr to the address buffer 400. The rewrite data Mdata_f may transfer to the memory cell array 200 by the data buffer 700 and the address buffer 400 may control the row decoder 500 and/or the column decoder 600 based on the received matching address Maddr. The control logic circuit 300 may control various internal circuits within the memory device 10 to write the rewrite data Mdata_f to memory cells corresponding to the matching address Maddr. By this rewrite operation, the memory device 10 including the internal operation circuit 100 may change the format of the data written to the memory cell array 200 and may rewrite the format-changed data to the memory cell array 200.

When the application operation instruction INS_ao is the copy operation instruction INS_copy, the result generator 130*b* may further receive a target address Gaddr on which a copy operation is to be performed. Thereafter, the result generator 130*b* may output the matching data Mdata to the data buffer 700 and also output the target address Gaddr to the address buffer 400. The matching data Mdata may transfer to the memory cell array 200 by the data buffer 700 and the address buffer 400 may control the row decoder 500 and/or the column decoder 600 based on the received target address Gaddr. The control logic circuit 300 may control various internal circuits within the memory device 10 to write the matching data Mdata to memory cells corresponding to the target address Gaddr. In example embodiments, the matching address Maddr and the target address Gaddr may be addresses of different banks. For example, when the matching address Maddr is the address of the first bank BK1 and the target address Gaddr is the address of a second bank BK2, the matching data Mdata may be copied into the second bank BK2 as a result of a copy operation. In example embodiments, the copy operation may be performed in the same bank of the memory cell array 200.

When the application operation instruction INS_ao is the move operation instruction INS_move, the result generator 130*b* may further receive a target address Gaddr on which a move operation is to be performed. Thereafter, the result generator 130*b* may output the matching data Mdata to the data buffer 700 and output the target address Gaddr to the address buffer 400. The matching data Mdata may be transferred to the memory cell array 200 by the data buffer 700 and the address buffer 400 may control the row decoder 500 and/or the column decoder 600 based on the received matching address Maddr and the target address Gaddr. The control logic circuit 300 may control various internal circuits within the memory device 10 to write the matching data Mdata to memory cells corresponding to the target address Gaddr. Thereafter, when data existing in the matching address Maddr is erased, a move operation may be completed. Similarly, the matching address Maddr and the target address Gaddr may be addresses of different banks. In example embodiments, the moving operation may be performed in the same bank of the memory cell array 200.

When the application operation instruction INS_ao is the swap operation instruction INS_swap, the result generator 130*b* may further receive a target address Gaddr on which a swap operation is to be performed. Thereafter, the result generator 130*b* may output the matching address Maddr and the target address Gaddr to the address buffer 400, and the address buffer 400 may control the row decoder 500 and/or the column decoder 600 based on the received matching address Maddr and the target address Gaddr. When the address buffer 400 receives the matching address Maddr and the target address Gaddr, the control logic circuit 300 may control various internal circuits within the memory device 10 to swap data of memory cells corresponding to the matching address Maddr with data of memory cells corresponding to the target address Gaddr. In example embodiments, the swap operation may be performed in the same bank or different banks of the memory cell array 200.

By these copy, move, and swap operations, the memory device 10 including the internal operation circuit 100 may perform data arrangement or rearrangement on the memory cell array 200.

In example embodiments, the result generator 130*b* may receive the rewrite data Mdata_f, the matching address Maddr, and the target addresses Gaddr from the host of the mode selector 110.

Figure 9A:
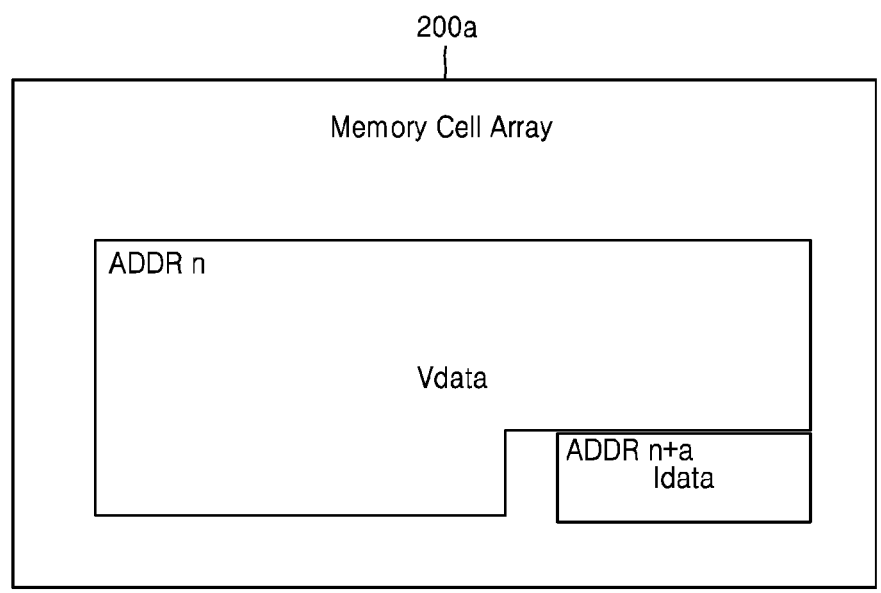
FIGS. 9A and 9B illustrate examples of data written to memory cell arrays according to example embodiments.
Figure 9B:
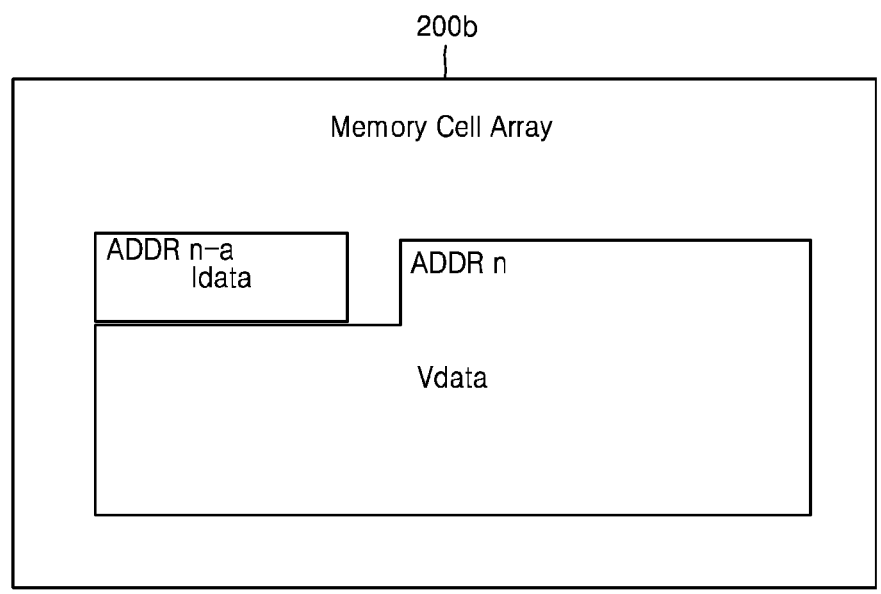

FIGS. 9A and 9B illustrate examples of data written to memory cell arrays 200*a* and 200*b* according to example embodiments.

Referring to FIGS. 2, 3, 9A, and 9B, the memory cell arrays 200*a* and 200*b* may include valid data Vdata and indication data Idata. The valid data Vdata contain valid contents and may denote data including substantial information, such as image data and document data. The indication data Idata may denote data serving as an indication of the valid data Vdata. The internal operation circuit 100 according to an example embodiment may search for the indication data Idata instead of searching for the valid data Vdata, during a search operation.

In the case of FIG. 9A, the indication data Idata has an address of n+a. In this case, since the indication data Idata has a greater address than an address of the valid data Vdata, which is n, the internal operation circuit 100 may output 'Up' as a search result. According to another embodiment, the internal operation circuit 100 may output, as a search result, the address of the valid data Vdata, namely, n, or the addresses of the indication data Idata, which is n+a.

In the case of FIG. 9B, the indication data Idata has an address of n−a. In this case, since the indication data Idata has a smaller address than the address of the valid data Vdata, namely, n, the internal operation circuit 100 may output 'Down' as a search result. According to another embodiment, the internal operation circuit 100 may output, as a search result, the address of the valid data Vdata, namely, n, or the addresses of the indication data Idata, which is n−a.

By this search operation, the host HOST may search for the indication data Idata instead of directly searching for the valid data Vdata. Accordingly, the valid data Vdata may be more effectively searched for.

Figure 10A:
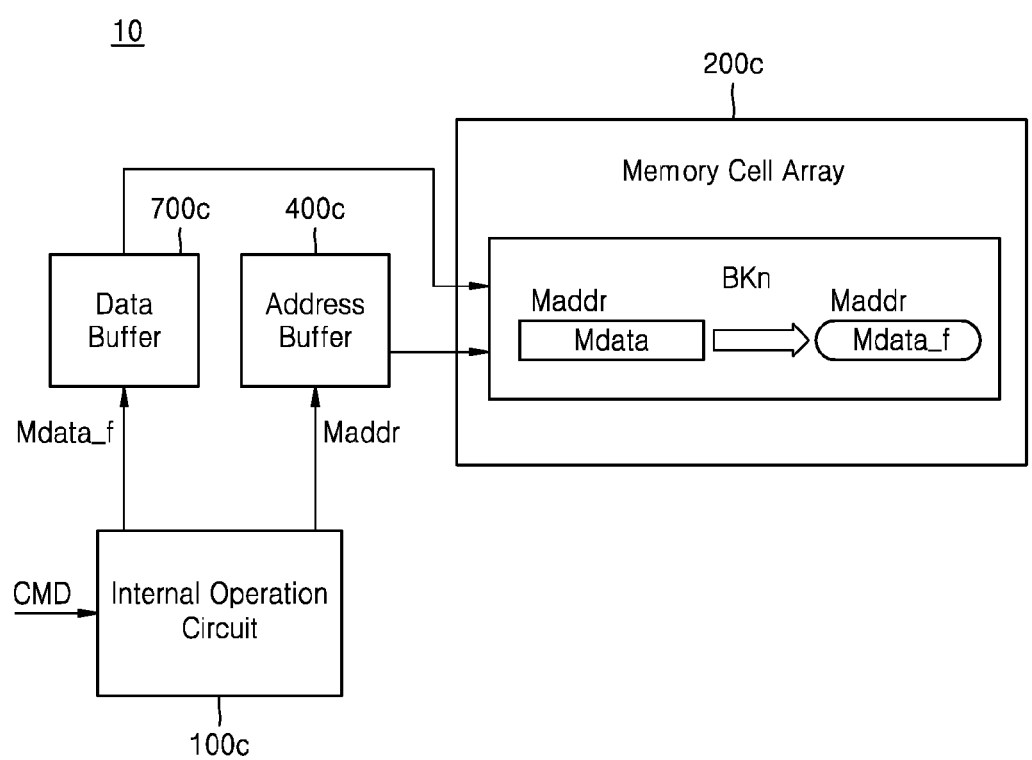
FIG. 10A is a block diagram of a memory device according to example embodiments.

FIG. 10A is a block diagram of a memory device 10 according to example embodiments. FIG. 10A is a block diagram for explaining a rewrite operation from among various application operations. A description of FIG. 10A that is the same as given above with reference to FIGS. 2 and 8C will not be repeated herein.

Referring to FIGS. 2, 8C, and 10A, the memory device 10 may include an internal operation circuit 100c, a memory cell array 200c, an address buffer 400, and a data buffer 700c. In response to a command CMD for a rewrite operation, the internal operation circuit 100c may output the matching address Maddr of the data found by a PBC to the address buffer 400c, and may output the rewrite data Mdata_f to the data buffer 700c. The rewrite data Mdata_f may be transferred to memory cells of a bank BKn in the memory cell array 200c by the data buffer 700c and the address buffer 400c may control the row decoder 500 and/or the column decoder 600 based on the received matching address Maddr. The control logic circuit 300 may control various internal circuits within the memory device 10 to rewrite the data stored in memory cells corresponding to the matching address Maddr of the memory cell array 200c as the rewrite data Mdata_f.

Figure 10B:
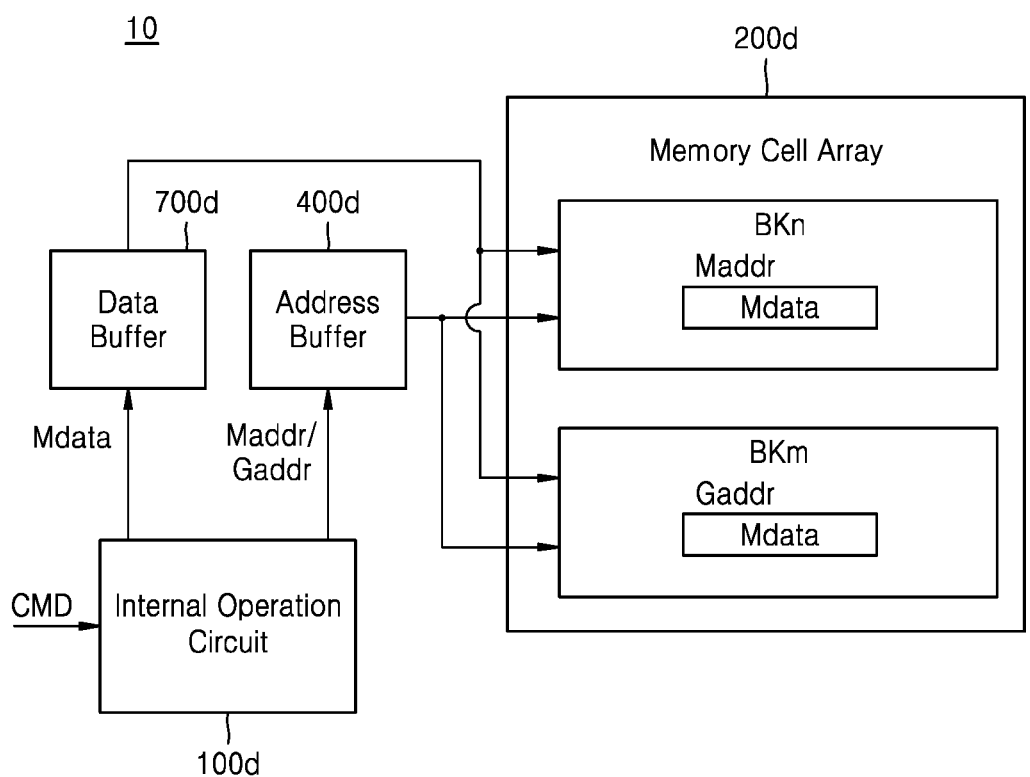
FIG. 10B is a block diagram of a memory device according to example embodiments.

FIG. 10B is a block diagram of a memory device 10 according to example embodiments. FIG. 10B is a block diagram for explaining a copy operation, a move operation, and a swap operation among various application operations. A description of FIG. 10B that is the same as given above with reference to FIGS. 2 and 8C will not be repeated herein.

Referring to FIGS. 2, 8C, and 10B, the memory device 10 may include an internal operation circuit 100d, a memory cell array 200d, an address buffer 400d, and a data buffer 700d. In response to a command CMD for a copy operation, the internal operation circuit 100d may output a target address Gaddr to the address buffer 400d and may output the matching data Mdata to the data buffer 700d. The address buffer 400d may control the row decoder 500 and/or the column decoder 600 based on the received target address Gaddr corresponding to a bank BKm of the memory cell array 200d. The matching data Mdata of the bank BKn may be transferred to memory cells of a bank BKn in the memory cell array 200d by the data buffer 700. Then, the control logic circuit 300 performs a copy operation by writing the matching data Mdata to memory cells corresponding to the target address Gaddr of the memory cell array 200d.

In response to a command CMD for a move operation, the internal operation circuit 100d may output the matching address Maddr and a target address Gaddr to the address buffer 400d and may output the matching data Mdata to the data buffer 700d. The address buffer 400d may control the row decoder 500 and/or the column decoder 600 based on the received matching address Maddr and the target address Gaddr. The matching data Mdata stored in memory cells of the bank BKn corresponding to the matching address Maddr may be transferred to memory cells of the bank BKm corresponding to the target address Gaddr in the memory cell array 200d by the data buffer 700. Then, the data buffer 700d performs the move operation by writing the matching data Mdata to the target address Gaddr of the memory cell array 200d and erasing the data stored in the matching address Maddr.

In response to a command CMD for a swap operation, the internal operation circuit 100d may output the matching data Mdata and a target data Tdata to the data buffer 700d and output the matching address Maddr, and a target address Gaddr to the address buffer 400d. The address buffer 400d may control the row decoder 500 and/or the column decoder 600 based on the received matching address Maddr and the target address Gaddr. The matching data Mdata stored in memory cells of the bank BKn corresponding to the matching address Maddr may be swapped with the target data Tdata stored in memory cells of the bank BKm corresponding to the target address Gaddr in the memory cell array 200d by the data buffer 700. Then, the control logic circuit 300 reads data from the target address Gaddr of the memory cell array 200d, temporarily stores the read-out data in a latch (not shown), and writes the matching data Mdata to the target address Gaddr of the memory cell array 200d. Next, the control logic circuit 300 writes the data stored in the latch to the matching address Maddr to thereby perform a swap operation.

Figure 11:
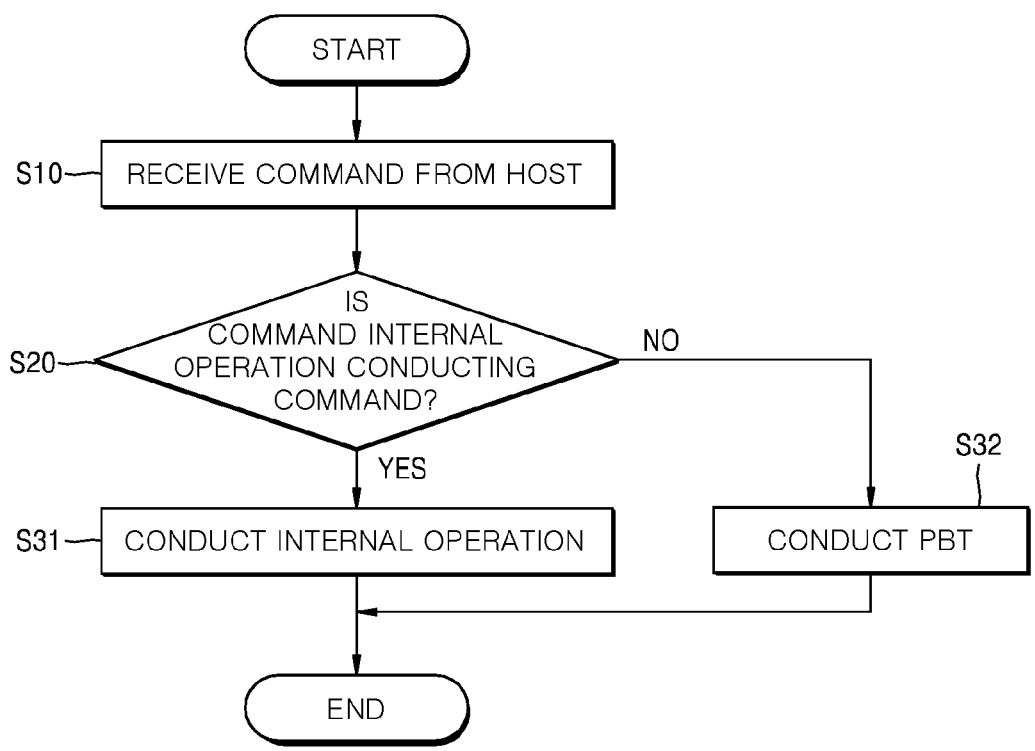
FIG. 11 is a flowchart of an operation of an internal operation circuit, according to example embodiments.

FIG. 11 is a flowchart of an operation of the internal operation circuit 100, according to example embodiments.

Referring to FIGS. 2 and 11, the internal operation circuit 100 receives the command CMD from the host HOST, in operation S10, and determines whether the command CMD is an internal operation conducting command, in operation S20. When the received command CMD is an internal operation conducting command, the internal operation circuit 100 performs an internal operation, in operation S31. Otherwise, the internal operation circuit 100 performs a PBT on the memory cell array 200, in operation S32.

Figure 12:
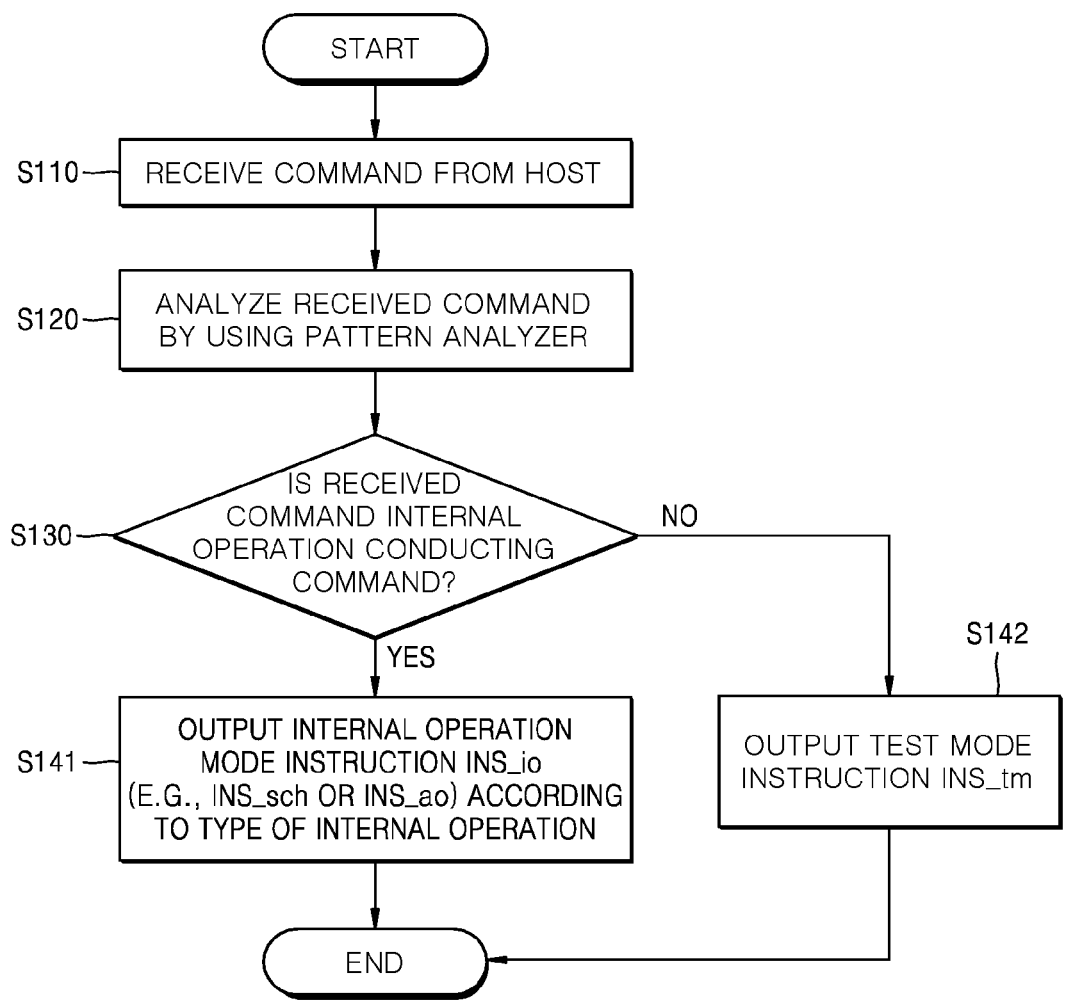
FIG. 12 is a flowchart of an operation of a mode selector, according to example embodiments.

FIG. 12 is a flowchart of an operation of the mode selector 110, according to example embodiments.

Referring to FIGS. 3, 4B, and 12, the mode selector 110 receives the command CMD from the host HOST, in operation S110, and analyzes the received command CMD by using the pattern analyzer 112b, in operation S120. When it is determined that the received command CMD is an internal operation conducting command, in operation S130, the mode selector 110 outputs the internal operation mode instruction INS_io (e.g., INS_sch or INS_ao) according to the type of an internal operation to the parallel bit comparator 120 and the result generator 130, in operation S141. When it is determined that the received command CMD is a test mode command, in operation S130, the mode selector 110 outputs the test mode instruction INS_tm, in operation S142.

Figure 13A:
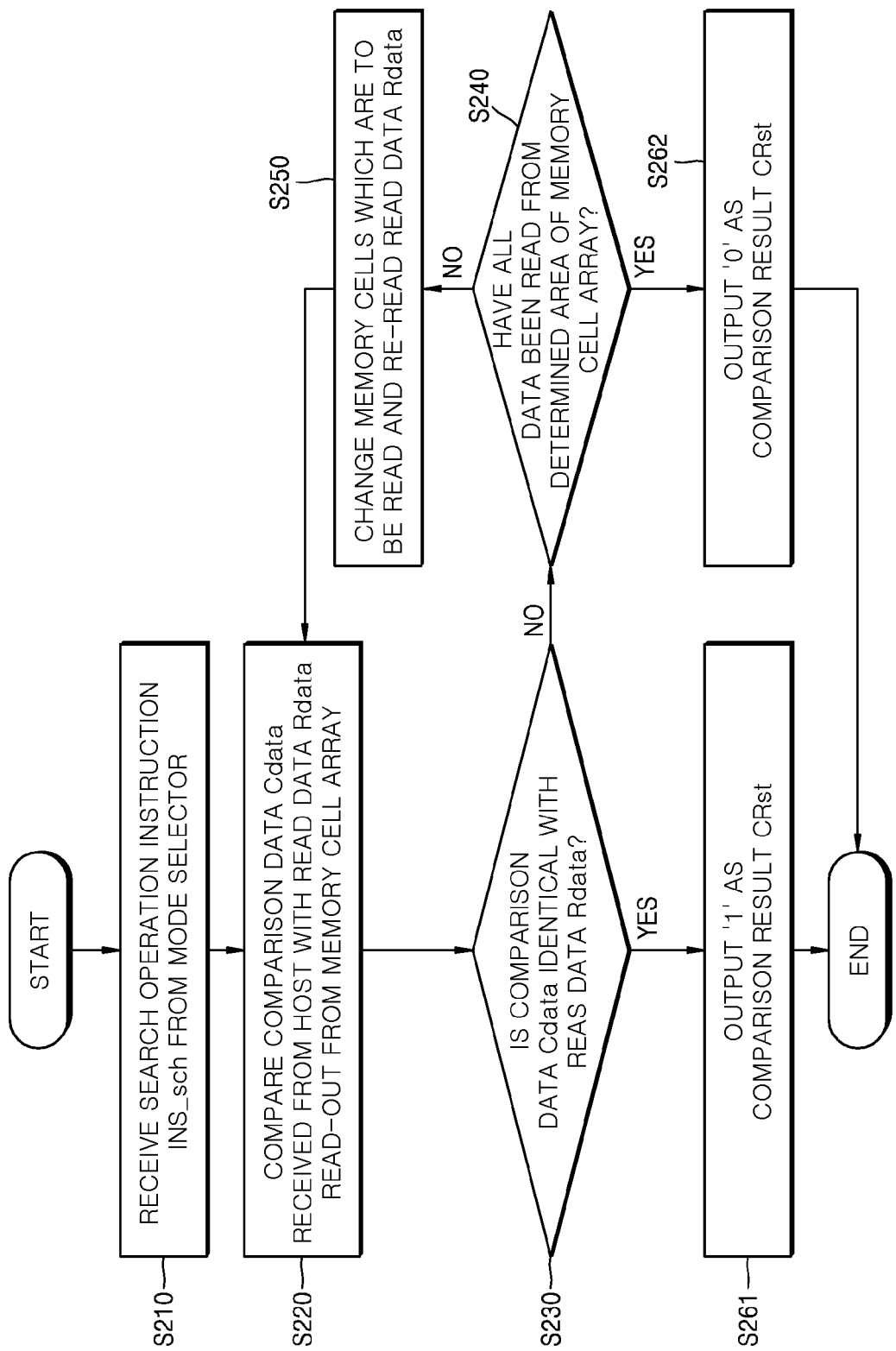
FIG. 13A is a flowchart of an operation of a parallel bit comparator according to example embodiments.

FIG. 13A is a flowchart of an operation of the parallel bit comparator 120 according to example embodiments. In detail, FIG. 13A is a flowchart of an operation of the parallel bit comparator 120 in response to the search operation instruction INS_sch from the mode selector 110. FIG. 13A may be a subsequent flowchart of FIG. 12.

Referring to FIGS. 2, 3, 7, 12, and 13A, the parallel bit comparator 120 may receive the search operation instruction INS_sch from the mode selector 110, in operation S210. In response to the search operation instruction INS_sch, the comparison circuit 121 may compare the comparison data Cdata received from the host HOST with the read data Rdata read-out from the memory cell array 200, in operation S220. When it is determined in operation S230 that the comparison data Cdata is different from the read data Rdata, the control logic circuit 300 may determine whether all data have been read from a determined area of the memory cell array 200, in operation S240. When all of the data have not been read, the control logic circuit 300 may change memory cells which are to be read, and re-read read data Rdata, in operation S250. When the comparison circuit 121 finally finds read data Rdata identical with the compare data Cdata by repeating a comparison between the comparison data Cdata and the read-out read data Rdata, the comparison circuit 121 may output '1' as the comparison result CRst to the result generator 130, in operation S261. When the comparison circuit 121 fails to find the read data Rdata identical with the comparison data Cdata even when all of the data have been read from the determined area, the comparison circuit 121 may output '0' as the comparison result CRst to the result generator 130, in operation S262.

Figure 13B:
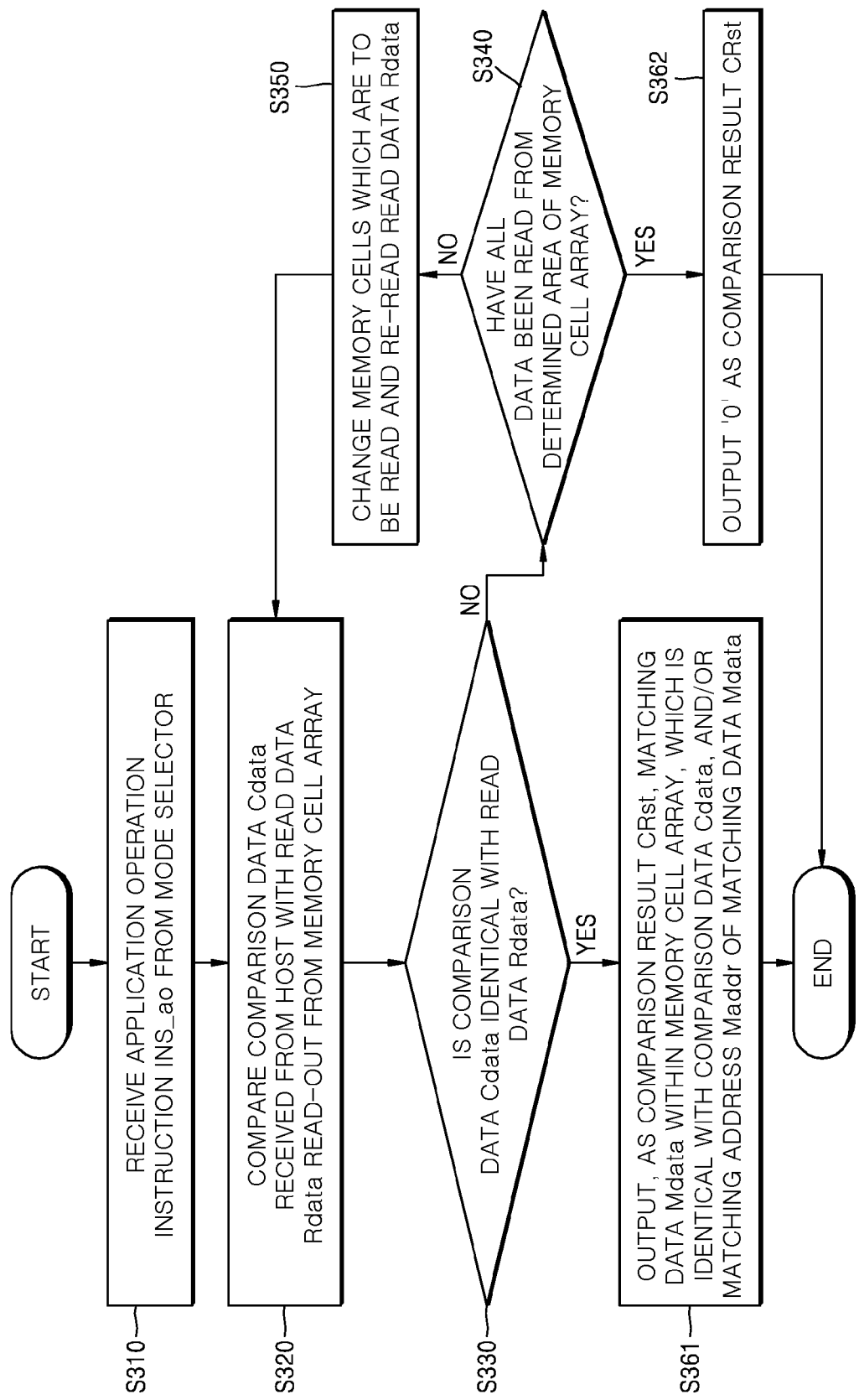
FIG. 13B is a flowchart of an operation of a parallel bit comparator according to example embodiments.

FIG. 13B is a flowchart of an operation of the parallel bit comparator 120 according to example embodiments. In detail, FIG. 13B is a flowchart of an operation of the parallel bit comparator 120 in response to the application operation instruction INS_ao from the mode selector 110. A description of FIG. 13B that is the same as given above with reference to FIG. 13A will not be repeated herein. FIG. 13B may be a subsequent flowchart of FIG. 12.

Referring to FIGS. 2, 3, 10A, 10B, 12, and 13B, the parallel bit comparator 120 may receive the application operation instruction INS_ao from the mode selector 110, in operation S310. In response to the application operation instruction INS_ao, the comparison circuit 121 may compare the comparison data Cdata received from the host HOST with the read data Rdata read-out from the memory cell array 200, in operation S320. By repeating a comparison as shown in FIG. 13A, the parallel bit comparator 120 may find the read data Rdata identical with the comparison data Cdata. In this case, the parallel bit comparator 120 may output, as the comparison result CRst, the matching data Mdata within the memory cell array 200, which is identical with the comparison data Cdata, and/or the matching address Maddr of the matching data Mdata to the result generator 130, in operation S361. When the parallel bit comparator 120 fails to find the read data Rdata identical with the comparison data Cdata even when all of the data have been read from the determined area, the parallel bit comparator 120 may output '0' as the comparison result CRst to the result generator 130, in operation S362.

Figure 14A:
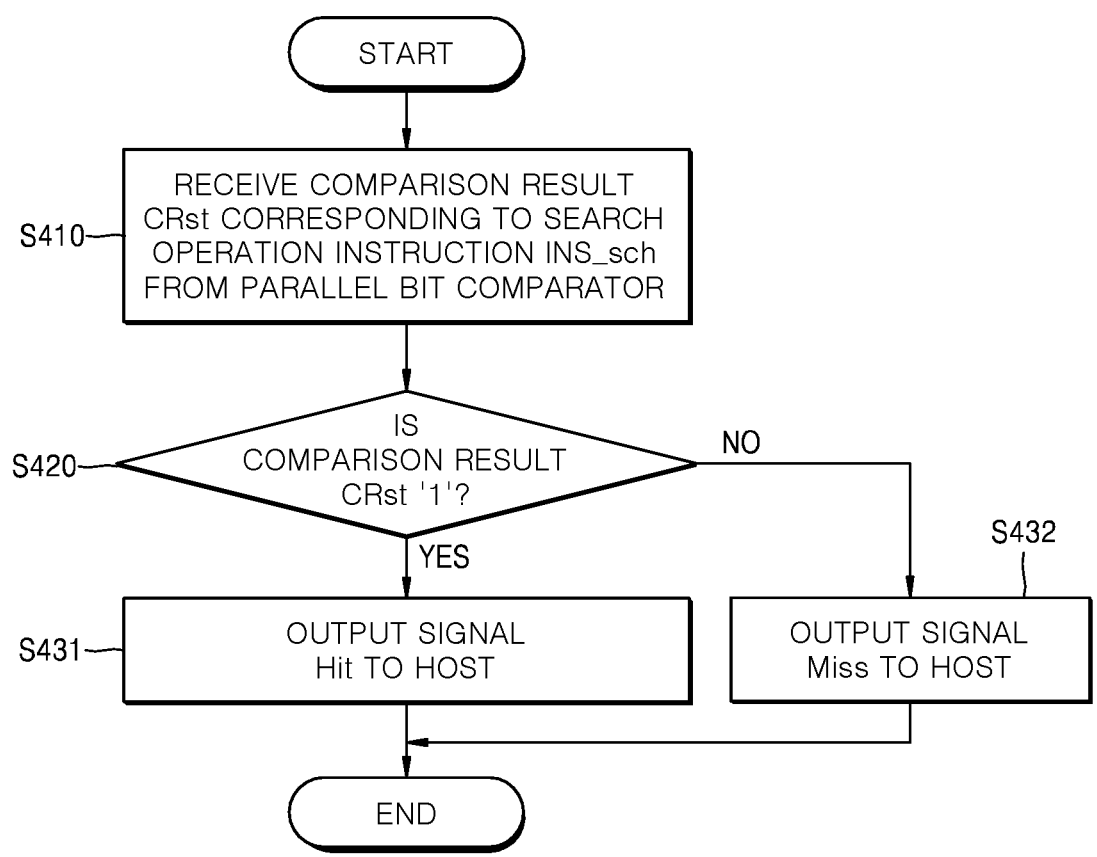
FIG. 14A is a flowchart of an operation of a result generator, according to example embodiments.

FIG. 14A is a flowchart of an operation of the result generator 130, according to example embodiments. In detail, FIG. 14A is a flowchart of an operation of the result generator 130 in response to the search operation instruction INS_sch from the mode selector 110. FIG. 14A may be a subsequent flowchart of FIG. 13A.

Referring to FIGS. 3, 8B, 13A, and 14A, the result generator 130 may receive a comparison result CRst corresponding to the search operation instruction INS_sch from the parallel bit comparator 120, in operation S410. The result generator 130 may determine whether the comparison result CRst is '1', in operation S420. When it is determined in operation S420 that the comparison result CRst is '1', the result generator 130 may output a signal Hit to the host HOST, in operation S431. When it is determined in operation S420 that the comparison result CRst is '0', the result generator 130 may output a signal Miss to the host HOST, in operation S432. In example embodiments, the signal Hit may be indicated as "1" and the signal Miss may be indicated as "0," or vice versa.

Figure 14B:
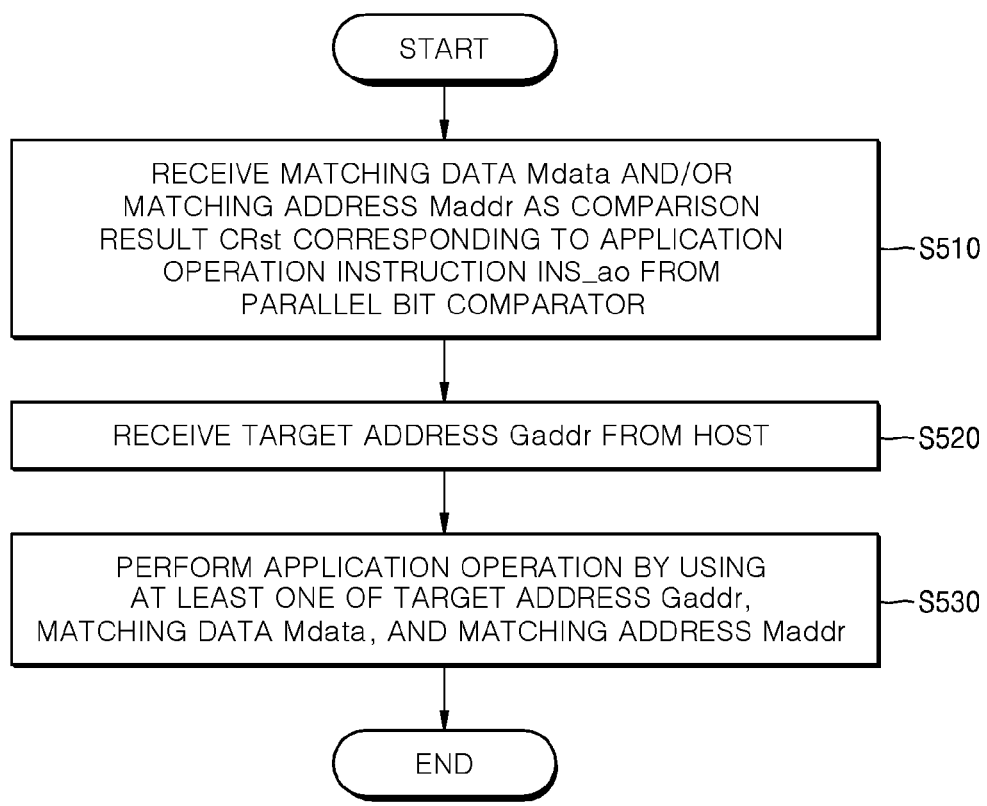
FIG. 14B is a flowchart of an operation of a result generator, according to example embodiments.

FIG. 14B is a flowchart of an operation of the result generator 130, according to example embodiments. In detail, FIG. 14B is a flowchart of an operation of the result generator 130 in response to the application operation instruction INS_ao from the mode selector 110. FIG. 14B may be a subsequent flowchart of FIG. 13B. A description of FIG. 14B that is the same as given above with reference to FIG. 8C will not be repeated herein.

Referring to FIGS. 2, 3, 8C, 13B, and 14B, the result generator 130 may receive the matching data Mdata and/or the matching address Maddr as a comparison result CRst corresponding to the application operation instruction INS_ao from the parallel bit comparator 120, in operation S510. When the application operation instruction INS_ao is the copy operation instruction INS_copy, the move operation instruction INS_move, or the swap operation instruction INS_swap, the result generator 130 may receive the target address Gaddr from the host HOST, in operation S520. In response to the application operation instruction INS_ao (e.g., INS_rewrite, INS_copy, INS_move, or INS_swap), the result generator 130 may output the target address Gaddr, the matching data Mdata, and the matching address Maddr to the address buffer 400 or the data buffer 700. In operation S530, the control logic circuit 300 may perform an application operation corresponding to the application operation instruction INS_ao by using at least one of the target address Gaddr, the matching data Mdata and the matching address Maddr.

Figure 15:
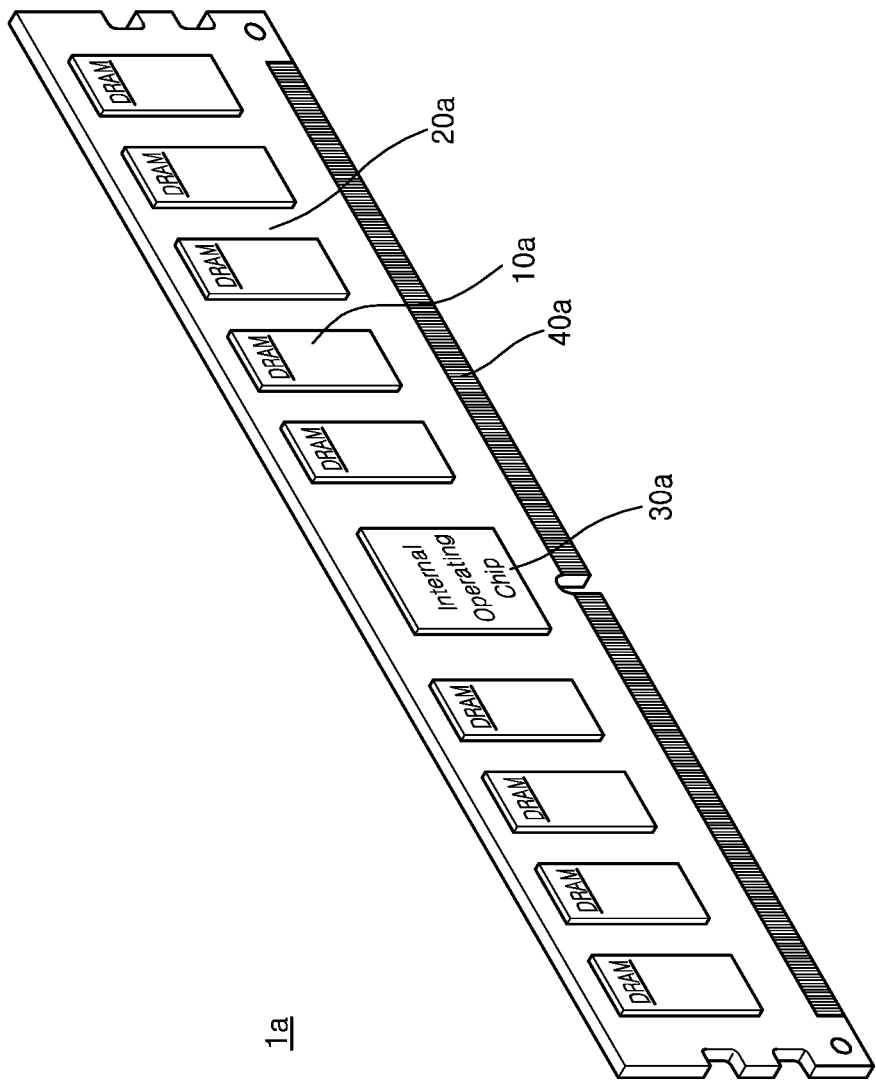
FIG. 15 illustrates a memory module including a memory device according to example embodiments.

FIG. 15 illustrates a memory module 1a including a memory device according to example embodiments. The memory module 1a may be applied to, for example, a single in-line memory module (SIMM), a dual in-line memory module (DIMM), a small-outline DIMM (SO-DIMM), an unbuffered DIMM (UDIMM), a fully-buffered DIMM (FB-DIMM), a rank-buffered DIMM (RBDIMM), a load-reduced DIMM (LRDIMM), a mini-DIMM, and a micro-DIMM.

Referring to FIG. 15, the memory module 1a may include a plurality of memory devices 10a, a printed circuit board (PCB) 20a, an internal operating chip 30a, and a connector 40a. The plurality of memory devices 10a and the internal operating chip 30a may communicate with a memory controller outside the memory module 1a via the connector 40a.

Each of the plurality of memory devices 10a may include a memory cell array, a data buffer, a row decoder, a column decoder, a command decoder, an address buffer, and the like.

The internal operating chip 30a may include the internal operation circuit 100 described above and perform an internal operation. The internal operating chip 30a may copy or move data written to one of the plurality of memory devices 10a to another memory device 10a or swap data written to one of the plurality of memory devices 10a with data written to another memory device 10a. The internal operating chip 30a may also perform a search operation of searching for data identical with the comparison data Cdata from one of the plurality of memory devices 10a. In example embodiments, each of the plurality of memory devices 10a and the internal operating chip 30a may be a type of chip or a type of package, or a package on package device.

Figure 16:
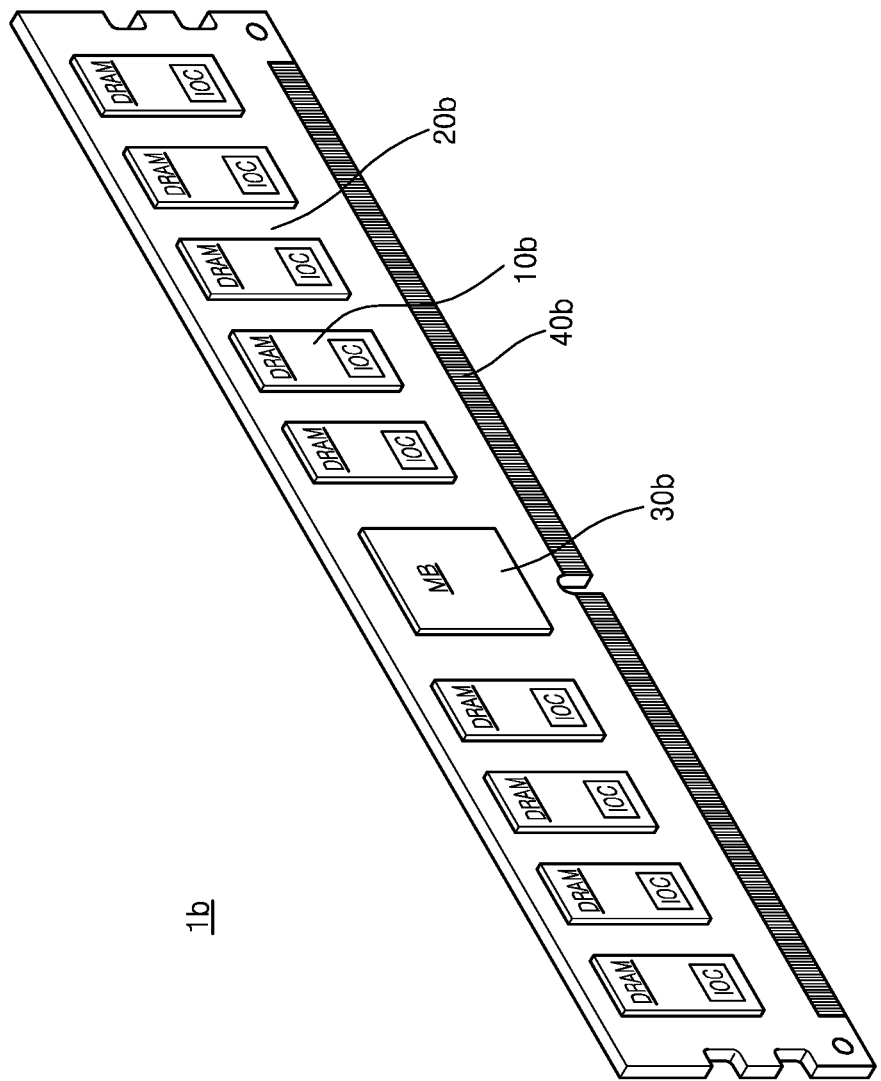
FIG. 16 illustrates a memory module including a memory device according to example embodiments.

FIG. 16 illustrates a memory module 1b including a memory device according to example embodiments. The memory module 1b may be applied to, for example, a single in-line memory module (SIMM), a dual in-line memory module (DIMM), a small-outline DIMM (SO-DIMM), an unbuffered DIMM (UDIMM), a fully-buffered DIMM (FB-DIMM), a rank-buffered DIMM (RBDIMM), a load-reduced DIMM (LRDIMM), a mini-DIMM, and a micro-DIMM.

Referring to FIG. 16, the memory module 1b may include a plurality of memory devices 10b, a PCB 20b, a buffer chip 30b, and a connector 40b. The plurality of memory chips 10b and the buffer chip 30b may communicate with a memory controller outside the memory module 1b, via the connector 40b.

Each of the plurality of memory devices 10b may include a memory cell array, a data buffer, a row decoder, a column decoder, a command decoder, an address buffer, and an internal operation circuit IOC. The internal operation circuit IOC may be the internal operation circuit 100 described above and perform an internal operation.

The buffer chip 30b may communicate with the plurality of memory devices 10b, and may temporarily store data received from outside the memory module 1b or data transmitted to the outside of the memory module 1b.

While the inventive concept has been particularly shown and described with reference to embodiments thereof, it will be understood that various changes in form and details may be made therein without departing from the spirit and scope of the following claims.

What is claimed is:

1. A memory device comprising:
a memory cell array comprising a plurality of memory cells; and
an internal operation circuit configured to perform both a test operation and an internal operation using a parallel bit operation of simultaneously comparing a plurality of bits,
wherein the internal operation circuit is configured to perform the test operation in a test mode of the memory device and the internal operation in an internal operation mode other than the test mode of the memory device based on a command signal received from an outside of the memory device, and
wherein the internal operation circuit comprises:
a mode selector configured to provide comparison data received from a host to a parallel bit comparator,
wherein the parallel bit comparator is configured to compare read data from the memory cell array with the comparison data to find second data corresponding to the comparison data, and to compare an address of valid data indicated by the second data with an address of the second data to output a result of the comparison to a result generator, and
wherein the result generator is configured to output the comparison result obtained by the parallel hit comparator.

2. The memory device of claim 1, wherein the mode selector is configured to set a mode of the internal operation circuit as the test mode or the internal operation mode, and
wherein the parallel bit comparator is configured to perform a parallel bit comparison (PBC) between data read out from the memory cell array and the comparison data using the parallel bit operation.

3. The memory device of claim 2, wherein the mode selector comprises a pattern analyzer configured to set the mode of the internal operation circuit as the internal operation mode based on the command signal including data or an address that is received from an outside of the memory device.

4. The memory device of claim 2, wherein the memory device includes a control logic circuit configured to control the memory device, and
wherein the mode selector is configured to set the mode of the internal operation circuit as the internal operation mode according to a signal received from an external pin or a command signal received from the control logic circuit.

5. The memory device of claim 1, wherein the parallel bit comparator is configured to perform a comparison operation of comparing read data from the memory cell array with the comparison data and searching for first data matched with the comparison data from the memory cell array.

6. The memory device of claim 5, wherein, when the parallel bit comparator finds the first data, the result generator is configured to output a hit signal to the host, and when the parallel bit comparator does not find the first data, the result generator is configured to output a miss signal to the host.

7. The memory device of claim 5, wherein the parallel bit comparator is configured to control a fine comparison operation of comparing the comparison data with the read data in units of bits or bytes and outputting a result of the comparison.

8. The memory device of claim 5, wherein the parallel bit comparator is configured to perform a fine comparison operation of comparing the comparison data with the read data in units of bits or bytes and combining and outputting results of the fine comparisons.

9. The memory device of claim 5, further comprising:
a control logic circuit configured to control the memory device,
wherein the control logic circuit is configured to perform a data processing operation according to the internal operation by using at least one of the first data and an address corresponding to the first data.

10. The memory device of claim 9, wherein the internal operation circuit is configured to perform the internal operation by the control logic circuit by changing a format of the first data and rewriting the changed format of the first data to an address corresponding to the first data.

11. The memory device of claim 9, wherein:
the memory device is configured to receive one or more target addresses from an external source, and
the internal operation circuit is configured to perform, as the internal operation by the control logic circuit, at least one of:
a copy operation of copying the first data to memory cells corresponding to a first target address;
a move operation of moving the first data to memory cells corresponding to a second target address; and
a swap operation of swapping the first data with second data stored in memory cells corresponding to a third target address.

12. The memory device of claim 11, wherein:
the memory cell array comprises a first area and a second area that is more frequently accessed by the host than the first area, and
the one or more target addresses corresponds to the second area.

13. A semiconductor device comprising:
an internal operation circuit configured to perform a test operation in a test mode using a parallel bit operation of simultaneously comparing a plurality of bits, and to perform an internal operation comprising a comparison operation with respect to external data in a normal mode other than the test mode by using the parallel bit operation,
wherein the internal operation circuit comprises:
a mode selector configured to set a mode of the internal operation circuit as the test mode or an internal operation mode of the normal mode;
a parallel bit comparator configured to perform a parallel bit comparison (PBC) between data read out from a memory cell array and the external data received from an outside of the semiconductor device by using the parallel bit operation; and
a result generator configured to output a comparison result obtained by the parallel bit comparator,
wherein, in the internal operation, the internal operation circuit is configured to find the external data from the memory cell array by using the parallel bit operation, and wherein:

the semiconductor device is configured to read data from a memory cell array within or outside the semiconductor device, and the internal operation circuit is configured to perform, as the internal operation, at least one of:

a search operation of comparing the data read out from the memory cell array with comparison data received from a memory controller to find first data identical to the comparison data and outputting a hit signal to a host when the first data is found;

a copy operation of receiving a first target address from the memory controller and copying the first data to memory cells of the memory cell array corresponding to the first target address;

a move operation of receiving a second target address from the memory controller and moving the first data to memory cells of the memory cell array corresponding to the second target address; and a swap operation of receiving a third target address from the memory controller and swapping the first data with second data stored in memory cells of the memory cell array corresponding to the third target address.

14. A memory device comprising:

a memory cell array comprising a plurality of memory cells; and an internal operation circuit including a parallel bit comparator configured to simultaneously compare first data from a first set of memory cells of the memory cell array with second data received from outside the memory device in an internal operation mode of the memory device, wherein the parallel bit comparator is configured to operate in a test mode of the memory device for a parallel bit operation, wherein, in the internal operation mode, the internal operation circuit is configured to find the second data from the memory cell array by using the parallel bit operation, wherein the internal operation circuit is configured to perform at least one of:

a rewrite operation of rewriting the second data in the first set of memory cells of the memory cell array corresponding to a first address, a copy operation of copying the first data to a second set of memory cells of the memory cell array corresponding to a second address, a move operation of moving the first data to a third set of memory cells of the memory cell array corresponding to a third address, and a swap operation of swapping the first data with a third data stored in a fourth set of memory cells of the memory cell array corresponding to a fourth address.

15. The memory device of claim 14, wherein the internal operation circuit is configured to, when the memory device operates in the internal operation mode, provide an output signal to either an internal circuit of the memory device or an outside of the memory device, and wherein the output signal of the internal operation circuit includes first data and a first address signal.

16. The memory device of claim 15, wherein the internal circuit of the memory device includes an address buffer and a data buffer both connected to the internal operation circuit, and wherein the data buffer is configured to write the first data to the memory cell array, and the address buffer is configured to receive the first address signal in the internal operation mode.

17. The memory device of claim 14, wherein the internal operation circuit includes a mode selector configured to receive a command signal from either an internal control logic circuit of the memory device or an outside of the memory device, and to output a test mode instruction signal such that the memory device performs the parallel bit operation and an internal operation mode instruction signal such that the memory device performs an internal operation based on the received command signal.

* * * * *